United States Patent
Bodla et al.

(10) Patent No.: US 11,683,919 B2
(45) Date of Patent: Jun. 20, 2023

(54) CONFORMAL HEAT PIPE ASSEMBLIES

(71) Applicant: General Electric Company, Schenectady, NY (US)

(72) Inventors: Karthik Bodla, Watervliet, NY (US); Nathaniel Benedict Hawes, Milton, NY (US); Brian Magann Rush, Niskayuna, NY (US); Weijun Yin, Niskayuna, NY (US); Andrew Thomas Cross, Waterford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/399,371

(22) Filed: Aug. 11, 2021

(65) Prior Publication Data

US 2021/0378154 A1 Dec. 2, 2021

Related U.S. Application Data

(62) Division of application No. 16/203,161, filed on Nov. 28, 2018, now Pat. No. 11,122,715.

(Continued)

(51) Int. Cl.
*H02K 9/22* (2006.01)
*H05K 7/20* (2006.01)
(Continued)

(52) U.S. Cl.
CPC ..... *H05K 7/20936* (2013.01); *F28D 15/0233* (2013.01); *F28D 15/0275* (2013.01);
(Continued)

(58) Field of Classification Search
CPC ........... H05K 7/20936; H05K 7/20945; H05K 7/20336; F28D 15/0233; F28D 15/0275;
(Continued)

(56) References Cited

U.S. PATENT DOCUMENTS 3,801,843 A 4/1974 Corman et al.
4,406,959 A 9/1983 Harano et al.
(Continued)

FOREIGN PATENT DOCUMENTS

CN 1780543 A 5/2006
CN 107659018 A 2/2018
(Continued)

OTHER PUBLICATIONS

AAVID Thermacore, Heat Pipe Technology, 2 Pages. https://www.themacore.com/thermal-basics/heat-pipe-technology.aspx.
(Continued)

*Primary Examiner* — Thomas Truong
(74) *Attorney, Agent, or Firm* — Dority & Manning, P.A.

(57) ABSTRACT

A heat pipe assembly includes walls having porous wick linings, an insulating layer coupled with at least one of the walls, and an interior chamber sealed by the walls. The linings hold a liquid phase of a working fluid in the interior chamber. The insulating layer is directly against a conductive component of an electromagnetic power conversion device such that heat from the conductive component vaporizes the working fluid in the porous wick lining of the at least one wall and the working fluid condenses at or within the porous wick lining of at least one other wall to cool the conductive component of the electromagnetic power conversion device. The assembly can be placed in direct contact with the device while the device is operating and/or experiencing time-varying magnetic fields that cause the device to operate.

18 Claims, 15 Drawing Sheets

Related U.S. Application Data

(60) Provisional application No. 62/670,460, filed on May 11, 2018.

(51) Int. Cl.
  *F28D 15/02* (2006.01)
  *F28D 15/04* (2006.01)
  *H01F 27/18* (2006.01)

(52) U.S. Cl.
  CPC ............ *F28D 15/046* (2013.01); *H01F 27/18* (2013.01); *H02K 9/225* (2021.01); *H05K 7/20945* (2013.01); *F28D 2015/0216* (2013.01)

(58) Field of Classification Search
  CPC ........... F28D 15/046; F28D 2015/0216; F28D 15/04; F28D 15/02; H01F 27/18; H02K 9/225; Y02E 10/44; F24S 10/95; F28F 2265/24; F28F 21/086
  See application file for complete search history.

(56) References Cited

U.S. PATENT DOCUMENTS

| | | |
|---|---|---|
| 5,283,488 A | 2/1994 | Ponnappan et al. |
| 6,499,532 B1 | 12/2002 | Williams |
| 6,943,467 B2 | 9/2005 | Potoradi et al. |
| 7,069,978 B2 | 7/2006 | Rosenfeld et al. |
| 7,168,480 B2 | 1/2007 | Jankowski et al. |
| 7,378,766 B2 | 5/2008 | Vasilescu et al. |
| 7,629,716 B2 | 12/2009 | Neal |
| 7,683,509 B2 | 3/2010 | Neal |
| 7,743,502 B2 | 6/2010 | Rosenfeld et al. |
| 7,976,291 B2 | 7/2011 | Vinson et al. |
| 8,283,818 B2 | 10/2012 | Hassett et al. |
| 8,952,582 B2 | 2/2015 | Le Besnerais |
| 9,071,100 B2 | 6/2015 | Chang et al. |
| 9,230,726 B1 | 1/2016 | Parker et al. |
| 9,331,552 B2 | 5/2016 | Fedoseyev et al. |
| 9,543,809 B2 | 1/2017 | Hodowanec et al. |
| 9,653,968 B2 | 5/2017 | Andersen et al. |
| 9,671,172 B2 | 6/2017 | Pal et al. |
| 9,905,359 B2 | 2/2018 | Sultenfuss et al. |
| 11,043,876 B2 * | 6/2021 | Bodla .................... B64D 33/08 |
| 11,122,715 B2 * | 9/2021 | Bodla .................... F28D 15/04 |
| 2005/0061486 A1 | 3/2005 | Yang |
| 2006/0038450 A1 | 2/2006 | Matin et al. |
| 2010/0170660 A1 | 7/2010 | Wang et al. |
| 2012/0085519 A1 | 4/2012 | Chou |
| 2012/0280580 A1 | 11/2012 | Tso et al. |
| 2012/0305226 A1 * | 12/2012 | Chamberlin ........... H02K 5/203 |
| | | 29/890.03 |
| 2013/0308272 A1 | 11/2013 | Furuta |
| 2013/0312939 A1 * | 11/2013 | Uchida ................. H01L 23/427 |
| | | 165/104.26 |
| 2015/0289413 A1 | 10/2015 | Rush et al. |
| 2017/0064868 A1 | 3/2017 | Rush et al. |
| 2017/0067693 A1 | 3/2017 | Rush et al. |
| 2017/0363363 A1 | 12/2017 | Lassini et al. |
| 2018/0356794 A1 | 12/2018 | Wiedenhoefer et al. |
| 2020/0178941 A1 | 6/2020 | Thiagarajan et al. |
| 2020/0333084 A1 | 10/2020 | Rush et al. |
| 2020/0336045 A1 | 10/2020 | Bodla et al. |

FOREIGN PATENT DOCUMENTS

| | | |
|---|---|---|
| EP | 1717536 A1 | 11/2006 |
| JP | H06341778 A | 12/1994 |
| JP | H07307226 A | 11/1995 |
| JP | 20100154713 A | 7/2010 |
| KR | 20130048571 A | 5/2013 |
| WO | WO1992007227 A1 | 4/1992 |
| WO | WO2012/107684 A1 | 8/2012 |

OTHER PUBLICATIONS

Mochizuki et al., Thermal Management in High Performance Computers by Use of Heat Pipes and Vapor Chambers, and the Challenges of Global Warming and Environment, 2009 4th International Microsystems, Packaging, Assembly and Circuits Technology Conference, Taipei, Oct. 21-23, 2009, pp. 191-194.

Narendra Babu et al., Materials Used in Heat Pipe, vol. 2, Issues 4-5, 2015, pp. 1469-1478.

Raj et al., Enhancement of Heat Transfer in Heat Pipes Using TiO2/Benzene Based Nano-coolants, 2016 7th International Conference on Intelligent Systems, Modelling and Simulation (ISMS), Bangkok, Jan. 25-27, 2016, pp. 446-451.

Thompson et al., Additive Manufacturing of Heat Exchangers: A Case Study on a Multi-Layered Ti—AI—4V Oscillating Heat Pipe, Additive Manufacturing, vol. 8, Oct. 2015, pp. 163-174.

* cited by examiner

CONFORMAL HEAT PIPE ASSEMBLIES

CROSS-REFERENCE TO RELATED APPLICATIONS

This application is a divisional application of U.S. patent application Ser. No. 16/203,161 filed Nov. 28, 2018, and claims priority to U.S. Provisional Application No. 62/670,460, which was filed on May 11, 2018, the entire disclosures of which are incorporated herein by reference in their entirety.

FIELD

The subject matter described herein relates to heat pipes.

BACKGROUND

Electromagnetic (EM) power conversion devices generate heat during operation due to Joule heating. Examples of these types of devices include electric machines such as motors and generators, inductors, and transformers. The effectiveness of thermal management approach can restrict the power density, the power per unit volume, and/or the power per unit weight that can be achieved in these devices. Improving the thermal management approach can allow for increased amounts of electric current in the conductors of the devices, without exceeding safe operating temperature limits. Increasing the amount of current that can be conducted in the conductors of the devices can allow for improvements in the power densities of the devices.

One way to manage heat generated in devices are heat pipes. Some known heat pipes are made from a conductive material, such as copper. This conductive material generates additional heat when in the presence of high-frequency electromagnetic fields. As a result, the very heat pipes that should operate to carry heat away from the devices (e.g., away from conductive windings or coils of the devices) can generate additional heat due to the changing electromagnetic fields near the heat pipes, leading to drop in power conversion efficiency, in addition to potentially increasing the temperatures.

BRIEF DESCRIPTION

In one embodiment, a heat pipe assembly includes plural connected walls having porous wick linings along the walls, an insulating layer coupled with at least one of the walls on a side of the at least one wall that is opposite of the porous wick lining of the at least one wall, and an interior chamber disposed inside and sealed by the walls. The porous wick linings of the walls are configured to hold a liquid phase of a working fluid in the interior chamber. The insulating layer of the at least one wall is directly against a conductive component of an electromagnetic power conversion device such that heat from the conductive component vaporizes the working fluid in the porous wick lining of the at least one wall and the working fluid condenses at or within the porous wick lining of at least one other wall to cool the conductive component of the electromagnetic power conversion device. The assembly can be placed in direct contact with the device while the device is operating and/or experiencing time-varying magnetic fields that cause the device to operate.

In one embodiment, a heat pipe system includes plural heat pipe assemblies configured to be disposed directly against conductive windings of an electric motor to cool the windings. Each of the heat pipe assemblies includes plural connected walls having porous wick linings along the walls. The walls include at least an interior wall, an outer wall, and a connecting wall that couples the interior wall with the outer wall. Each of the heat pipe assemblies also includes an interior chamber disposed inside and sealed by the walls. The porous wick linings of the walls are configured to hold a liquid phase of a working fluid in the interior chamber. The interior walls of the heat pipe assemblies are configured to be located directly against the conductive windings of the motor such that heat from the conductive windings vaporizes the working fluid in the porous wick linings of the interior walls of the heat pipe assemblies. The working fluid condenses at or within the porous wick linings of the outer walls of the heat pipe assemblies to cool the conductive windings of the motor.

BRIEF DESCRIPTION OF THE DRAWINGS

The present inventive subject matter will be better understood from reading the following description of non-limiting embodiments, with reference to the attached drawings, wherein below.

DETAILED DESCRIPTION

Figure 1:
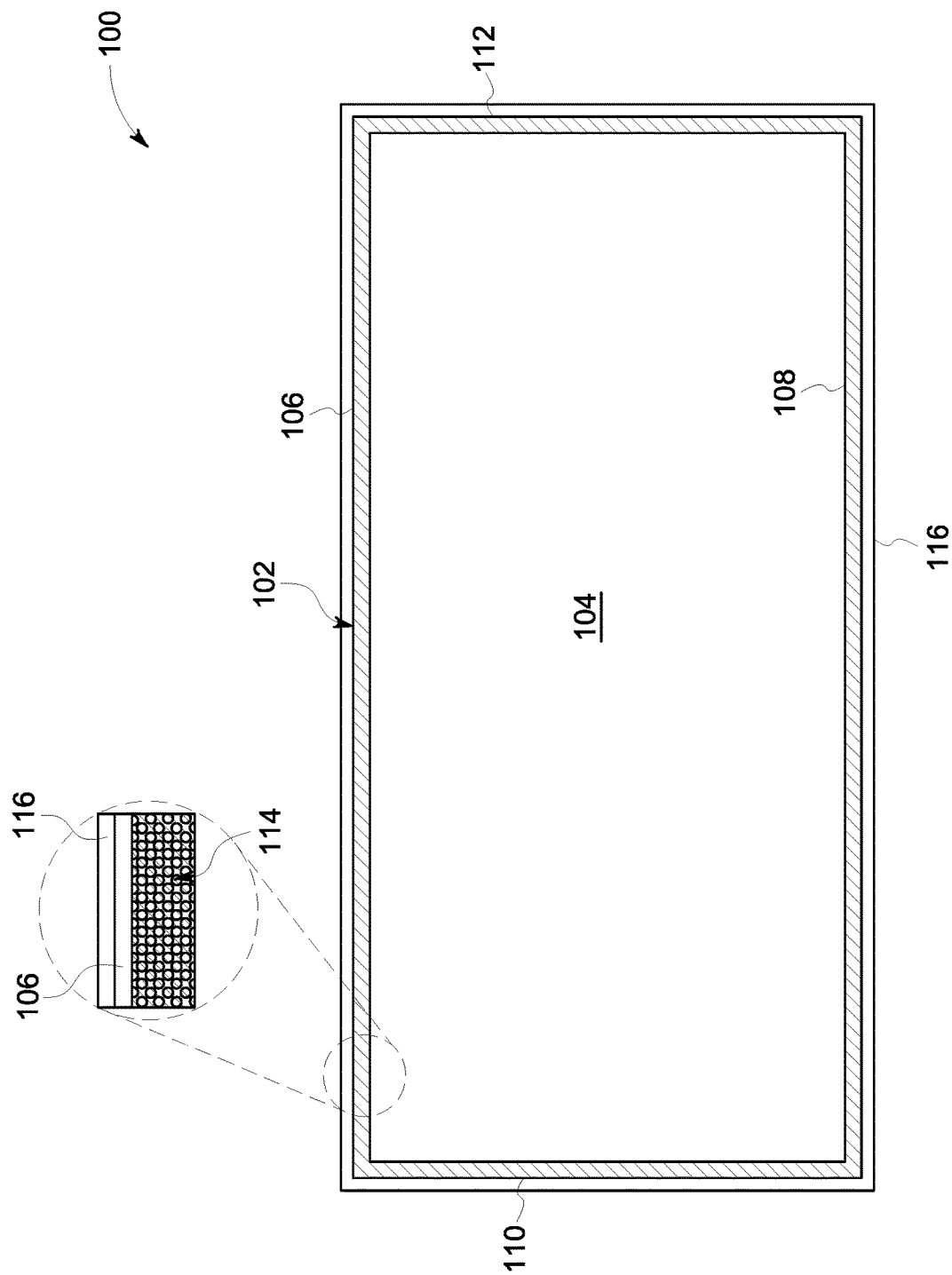
FIG. 1 illustrates one example of a cross-sectional view of a heat pipe assembly.

The subject matter described herein relates to heat pipes formed from one or more materials having lower electrical conductivity than known heat pipes (e.g., significantly lower than copper). For example, the conductivity of the material (s) used to form the heat pipes described herein can be at least one, and may be two or more orders of magnitude smaller than copper (in one embodiment). One or more embodiments of the heat pipes described herein can be formed from titanium, which has a significantly lower electrical conductivity than copper. The heat pipes can be coated conformally with high thermal conductivity ceramic insulation materials via electrophoretic deposition (EPD) for electrical isolation, which can maintain the thermal performance of the heat pipes while enhancing insulation properties of the heat pipes.

One embodiment of the inventive subject matter described herein provides a method involving coating a surface of the heat pipe with a ceramic material including a nitride, via an electrophoretic process, to form a first coating. The method further includes contacting the first coating deposited by the electrophoretic process with a thermoset resin to form a second coating; and curing the second coating to form the electrically insulating coating including the ceramic material dispersed in a polymer matrix. A suitable thermally conductive ceramic material includes aluminum nitride, boron nitride, diamond, aluminum oxide, or combinations thereof. A suitable thermoset resin in the ceramic matrix include an epoxy, a siloxane, polyester, polyurethane, cyanate ester, polyimide, polyamide, polyamideimide, polyesterimide, polyvinyl ester, or combinations thereof. Additionally, with additive manufacturing, conformal heat pipes can be form-fitted to practically any winding or coil shape of a machine. Finally, making the heat pipes out of high-strength titanium allows for the replacement of structural elements in heat pipes, such as slot wedges, end-bells, and/or motor housings, leading to dual-purpose thermal-mechanical structures with enhanced performance at reduced weight.

Thermal management in electrical machines typically involves heat extraction outside the magnetically active zones, by employing approaches such as liquid or air-cooled heat sinks. This approach may be termed 'remote cooling'. That is, the heat generated in the machine is conducted across several zones from the source to the sink, before the heat can be extracted. In an electric motor, for example, the heat generated in the copper conductors may be conducted through strand insulation, turn insulation, potting resin, ground-wall insulation, winding-core interface, core laminations, core-housing interface and fins, before the heat can be rejected to the surrounding working fluid. These various zones have limited thermal conductivities (e.g., windings ~0.5 W/m-K, insulation layers ~0.15 W/m-K, potting resin ~0.2 W/m-K, laminations ~25 W/m-K). Therefore, this approach limits the amount of heat that can be extracted and consequently limits the current that can be sustained in the devices.

Improvements to the above approach are also employed when higher performance and power densities are desired, such as by bringing the working fluid closer to the conductors when feasible (e.g., using hollow conductors and flowing the heat-extracting working fluid directly near the heat generating conductors in the devices). This approach, termed 'embedded cooling' or 'direct conductor cooling,' currently is employed in high voltage machines, where the insulation layers are significantly thicker and severely limit heat extraction via conventional approaches. This approach relies on clean, dielectric working fluids and needs additional infrastructure such as flow distribution manifolds, hoses and filters, for accomplishing the flow, adding to the overall cost and complexity of the design and reducing the overall power density.

Heat pipes or interior chambers are seeing increasing use to address similar heat extraction challenges in other applications such as electronics cooling. These devices operate on the principle of phase-change heat transfer in sealed tubes or enclosures, and when properly designed, efficiently carry heat from remote, hard to reach heat sources to the nearby, convenient heat sinks where the heat can be more easily extracted with minimal or reduced temperature drops. Properly designed heat pipes therefore operate as "thermal superconductors" in a thermal management system. The employment and acceptance of heat pipes in EM power conversion applications, however, has been limited for several reasons, such as commercially available heat pipes are typically made up of copper. When such heat pipes are used close to high frequency EM fields, significant eddy current induced heat generation results, causing an overall drop in efficiency and performance. Additionally, the area available for the windings or coils in these devices is compact and the winding profiles are non-standard (i.e., the windings are not always circular or rectangular).

Some known heat pipes or interior chambers may only be available in either rectangular or cylindrical tube configurations, further limiting use of these types of heat pipes or interior chambers in these applications. Additionally, owing to the voltage difference between the windings which are at the designed electrical potential, and the heat pipes which are at ground potential, electrical insulation may need to be employed. Typical electrical insulation materials such as NOMEX, KAPTON, mica and fiberglass, are also thermally insulating, cutting down the overall effectiveness of the heat pipes when used near the windings.

One or more embodiments of the inventive subject matter described herein address many, if not all, of the shortcomings of copper heat pipes described above. Additionally, form fitted, structural-thermal dual purpose mechanical elements can be formed for further improving the thermal performance of the heat pipes, along with overall weight reduction. The inventive heat pipe assemblies described herein can be used as heat pipes and interior chambers for cooling conductive coils of electric motors (including motors having concentrated windings and/or distributed windings). The assemblies can be conformal interior chamber end-bell assemblies used in motors to cool end-turns of motor windings of the motors. The assemblies can be conformal in that the assemblies have an exterior shape and/or size that conforms to (e.g., is complementary to or matches) the shape of at least a portion of an electrical machine, e.g. the end windings.

The assemblies can form housings of electrical machines, with the housing having interior chambers that conform to shapes of the electrical machines. One embodiment of the assemblies includes a sleeve or endplate of a rotor in a motor that includes a conformal interior chamber that cools the rotor. The assemblies can provide for rotor cooling for internal permanent magnets (IPM), surface permanent magnets (SPM), for induction machines (IM) which are singly or doubly excited, switched reluctance machines (SRM), synchronous reluctance machines (SynRM), or for field wound machines (FWM). The assemblies can provide for cooling of transformer and/or inductor windings with a heat pipe or interior chamber built or formed into a bobbin of the transformer, with an optional extension to a heat sink of the heat pipe that assists in drawing heat out and away from the windings.

While many examples of the uses of the heat pipe assemblies are described herein, not all uses of the heat pipe assemblies are limited to these examples. The heat pipe assemblies may be used to cool other magnetic devices, machines, or applications.

In one embodiment, the heat pipe assemblies are formed from titanium or titanium alloys. The heat pipe assemblies can be formed by additively manufacturing the shapes of the assemblies to conform with the shapes of the devices that are cooled by the assemblies. For example, the assemblies can be created using three-dimensional (3D) printing, rapid prototyping (RP), direct digital manufacturing (DDM), selective laser melting (SLM), electron beam melting (EBM), direct metal laser melting (DMLM), or the like.

The heat pipe assemblies can be formed from another material in place of or in addition to titanium. For example, the heat pipe assemblies can be formed from another material that is thermally conductive yet electrically resistive, such as stainless steel.

The heat pipe assemblies can be placed or formed in direct contact with the conductive windings of the magnetic devices described herein. This contrasts with some known heat pipe assemblies, which can require that insulation be placed between the exterior surface(s) of the heat pipe assemblies and the conductive windings of the magnetic devices. The heat pipe assemblies can be placed within the time-varying electro-magnetic fields that are generated to cause the devices to operate, in contrast with some known heat pipe assemblies, which are positioned outside of these fields. By applying the heat pipe assemblies directly to the source of heat in these devices, a significant thermal performance advantage may be realized relative to some known heat pipe assemblies.

One or more embodiments of the inventive subject matter described herein relates to integrated thermal and mechanical assemblies that can be used in devices for cooling conductive windings of the devices, including three-dimensional printed conformal interior chambers.

FIG. 1 illustrates one example of a cross-sectional view of a heat pipe assembly 100. The assembly 100 is shown in FIG. 1 to describe the basic operation of how the conformal heat pipe assemblies described herein remove thermal energy from an electrical and/or mechanical heat source (e.g., the conductive windings of an electro-magnetic device, such as a motor, inductor, transformer, induction heating coil, or the like) in steady and/or unsteady cooling conditions.

The assembly 100 includes a vapor housing 102 with low thermal resistance. The housing 102 can be formed using additive manufacturing (e.g., three-dimensional printing) and/or can be formed from a material having low thermal resistance and low electric conductivity (e.g., titanium, stainless steel, etc.). The vapor housing 102 defines and encloses an interior chamber 104. This chamber 104 may be hermetically sealed from the outside environment so that working fluid inside the chamber 104 (e.g., water) is not able to pass out of the chamber 104 through the housing 102 and/or is not able to enter the chamber 104 through the housing 102.

The housing 102 is defined by several walls 106, 108, 110, 112 that extend around and enclose the chamber 104. The walls 106, 108, 110, 112 are provided merely as one example of how the various heat pipe assemblies described herein can operate to remove heat from an electro-magnetic device. The number, size, and/or arrangement of the walls 106, 108, 110, 112 can change based on the shape of the electro-magnetic device to which the heat pipe assembly is to conform. Additionally, using additive manufacturing support walls may be built in specific places within the vapor space 104 if needed, to mechanically support the outer housing 102 and provide additional rigidity to the structure. The support walls can be configured to allow for the continuous flow of the vapor to offer minimal or reduced blockage.

Optionally, one or more of the exterior surfaces of the wall 106, 108, 110, and/or 112 can include or be coupled with an insulation layer 116. This insulation layer 116 can be formed from a dielectric material, a material that is not thermally conductive (or that is less thermally conductive than the wall 106, 108, 110, and/or 112), and/or a material that is not electrically conductive (or that is less electrically conductive than the wall 106, 108, 110, and/or 112). Examples of materials that the insulation layer 116 can be formed from include a polyamide, KAPTON, or NOMEX. In one embodiment, the insulation layer 116 is formed on one or more of the walls 106, 108, 110, and/or 112 using electrophoretic deposition. Alternatively, another deposition technique is used.

In one embodiment, the interior surfaces of one or more of the walls 106, 108, 110, and/or 112 include, are formed from, or are lined with a porous wick structure or lining 114. The porous wick structure 114 can be formed using additive manufacturing and may be formed from sintered powder. Alternatively, the porous wick structure 114 can be formed using another technique and/or from another material. The porous wick structure 114 can line the entire interior surfaces of the chamber 104 and can hold liquid working fluid. Optionally, not all walls may include the insulating layer 116 and/or the porous wick structure 114. For example, one or more of the walls may not include the wick structure 114, or a portion of at least one wall may not include the wick structure 114. As another example, one or more of the walls may not include the insulating layer 116, or a portion of at least one wall may not include the insulating layer 116. Optionally, one or more interior support columns or posts may extend from one wall to an opposite wall to mechanically support the walls away from each other.

The housing 102 conducts thermal energy from an electro-magnetic device through the walls 106, 108, 110, and/or 112, depending on which wall is next to the device. In some embodiments, multiple walls 106, 108, 110, 112 may be in contact with the same or different devices at the same time. In one example of operation of the assembly 100, the wall 108 may be in direct contact with a source of heat, such as the conductive windings of the device.

As the wall 108 absorbs thermal energy, the wall 108 transfers the thermal energy to a working fluid (e.g., water, ammonia, etc.) that is held within the chamber 104 and/or within pores of the porous wick structure 114 along the wall 108. This working fluid may be in a liquid state in the porous wicking structure 114. As the working fluid absorbs the thermal energy, the fluid changes phase from a liquid phase to a vapor phase and moves into the interior chamber 104. As the working fluid moves into the chamber 104 and/or toward the cooler walls 106, 110, and/or 112, the working fluid cools and condenses (e.g., changes from a vapor phase into a liquid phase). The liquid phase of the fluid then recirculates back into to the chamber 104 through gravity and/or capillary forces, where the fluid again absorbs thermal energy from the wall 108, thereby continuing the evaporation-condensation cycle.

For example, the sealed chamber 104 can hold the liquid phase of the working fluid and the gaseous phase of the working fluid in thermodynamic equilibrium. When heat is introduced into the chamber 104 (e.g., at one or more walls 106, 108, 110, 112) and heat is removed from the chamber 104 (e.g., at one or more other walls 106, 108, 110, 112 located farther from the heat source), a very efficient heat transfer process occurs. This process involves the heat entering the wall 106, 108, 110, or 112 and reaching the liquid working fluid in the porous wick lining 114 of the wall 106, 108, 110, or 112. The liquid working fluid is at least partially vaporized by the heat, and the vapor moves to where the vapor can condense, such as the interior of the chamber 104 and/or another wall 106, 108, 110, 112 located farther from the heat source. The vapor condenses back into a liquid phase and, upon doing so, releases heat back into the wall(s) 106, 108, 110, 112 located farther from the heat source. The liquid working fluid enters back into the porous wick lining 114 and can be drawn back toward the interior chamber 104 by capillary action (e.g., capillary wicking forces).

Figure 2:
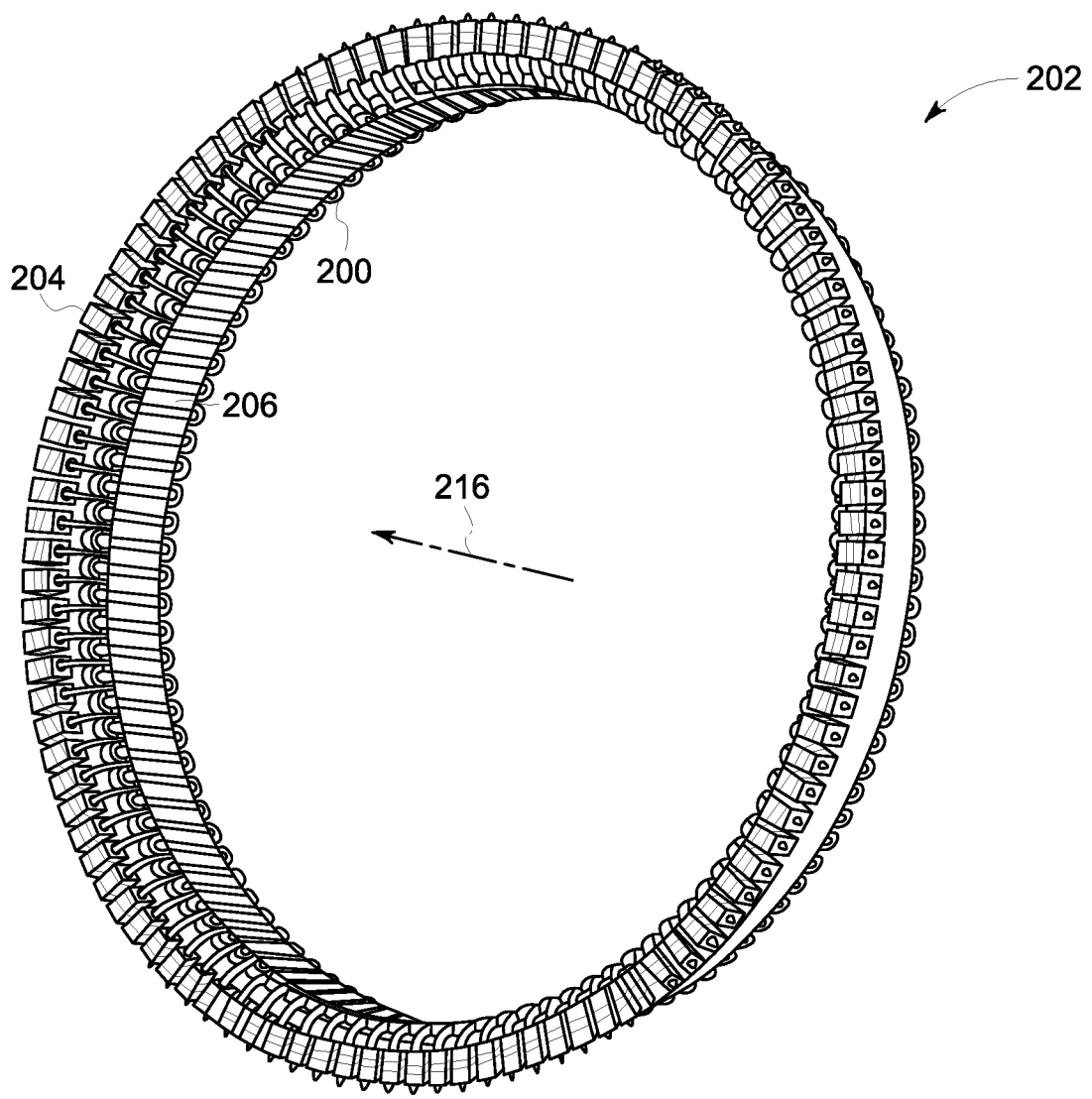
FIG. 2 illustrates a perspective view of conductive coils of a motor with one embodiment of conformal heat pipe assemblies.
Figure 3:
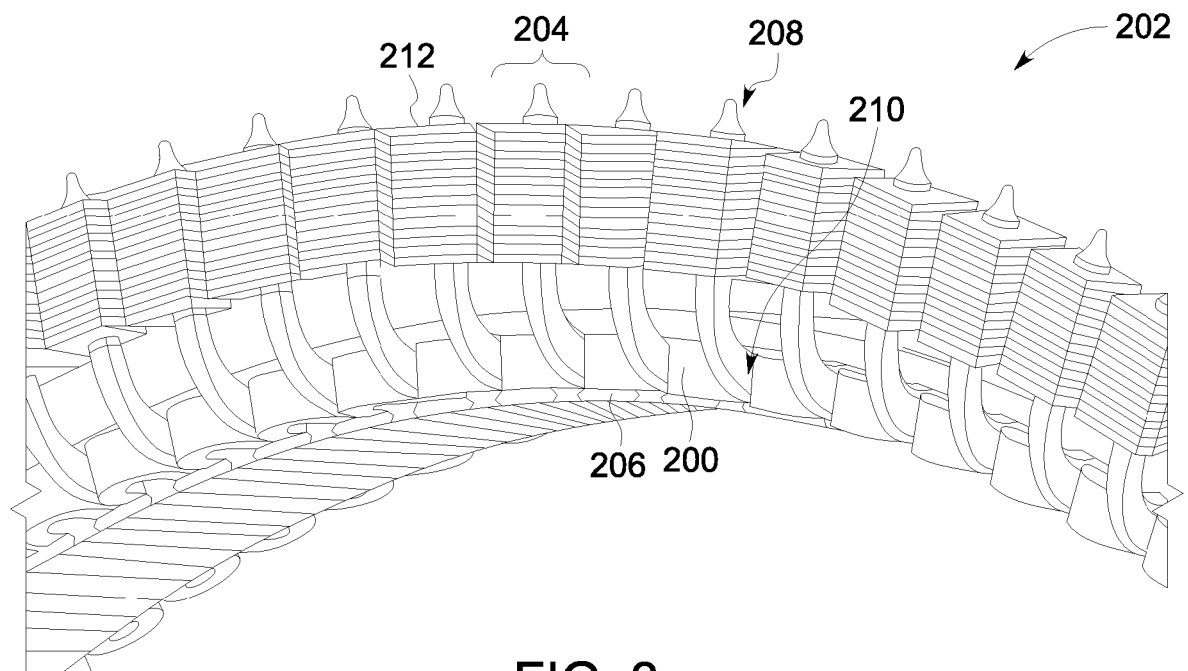
FIG. 3 is a perspective view of a portion of the conductive coils and heat pipe assemblies shown in FIG. 2.
Figure 4:
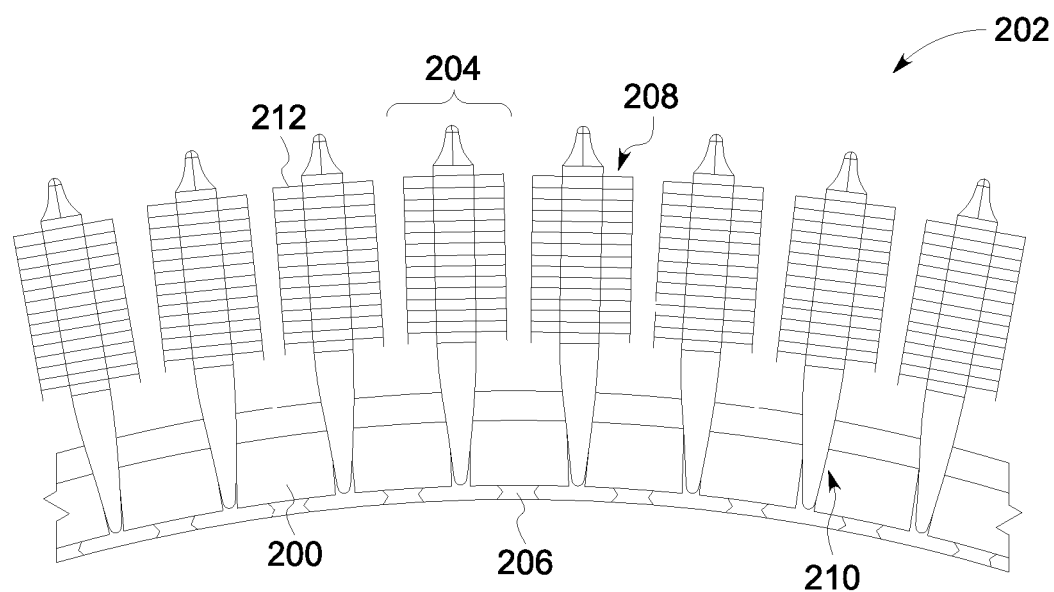
FIG. 4 is a front view of a portion of the conductive coils and heat pipe assemblies shown in FIG. 2.

FIG. 2 illustrates a perspective view of conductive coils 200 of a motor 202 with one embodiment of conformal heat pipe assemblies 204. FIG. 3 is a perspective view of a portion of the conductive coils 200 and heat pipe assemblies 204. FIG. 4 is a front view of a portion of the conductive coils 200 and heat pipe assemblies 204. The motor 202 is one example of an electro-magnetic power conversion device described herein. Only a ring portion 206 of a stator of the motor 202 is shown in FIG. 2, and the motor 202 may include additional components. The ring portion 206 can represent a portion of the inside or inner diameter of the stator. The ring 206 includes several conductive coils or windings 200 that when passing current through, produce magnetic fields which interact with the rotor (not shown), causing it to move.

The coils 200 can generate heat during operation of the motor 202. This heat can be dissipated or otherwise removed from the coils 200 by the heat pipe assemblies 204. The heat pipe assemblies 204 are L-shaped bodies in the illustrated embodiment. The heat pipe assemblies 204 include interior portions 210 that extend between neighboring coils 200 of the motor 202 and exterior portions 208 that are disposed outside of the coils 200 (e.g., are not located between the coils 200). The interior portions 210 are elongated in axial directions that are parallel to a center axis or axis of rotation 216 of the motor 202. The exterior portions 208 are elongated in radial directions that are perpendicular to the center axis or axis of rotation 216 of the motor 202. In the illustrated embodiment, the exterior portions 208 of the heat pipe assemblies 204 all are located on one side of the ring portion 206 of the stator of the motor 202. Additionally, the exterior portions of the heat pipe assemblies 204 all extend radially outward (e.g., away from the center axis or axis of rotation 216 of the motor 202) in the illustrated embodiment.

The heat pipe assemblies 204 can include interior chambers 104 having porous wick linings 114 with working fluid therein, as shown in FIG. 1. The heat pipe assemblies 204 can help to rapidly cool the coils 200 by removing heat from the coils 200, as described above in connection with the heat pipe assembly 100 shown in FIG. 1. For example, opposing walls 106, 108 in the interior portions 210 of the heat pipe assemblies 204 can be in direct contact with neighboring coils 200. Heat from the coils 200 vaporizes working fluid held in the porous wick linings 114 of the walls 106, 108, and the vapor working fluid then can move within the interior chambers 104 of the heat pipe assemblies 204 into the exterior portions 208 of the heat pipe assemblies 204 where there is less heat. The vapor working fluid can then condense back into the liquid working fluid (as described below), which then flows or is pulled (e.g., via capillary action) back into the porous wick linings 114 of the interior portions 210.

The walls 106, 108 of the interior portion 210 of each of the heat pipe assemblies 204 are in direct contact with the coils 200 that are on opposite sides of the heat pipe assembly 204, as shown in FIG. 4. For example, no additional material other than the material that forms the walls 106, 108 may be disposed between the wall 106 and/or 108 and the nearest coil 200.

The exterior portions 208 of the heat pipe assemblies 204 include several fins 212. These fins 212 may be hollow, elongated extensions that outwardly project from the interior chambers 104 of the exterior portions 208 of the heat pipe assemblies 204. This can allow for the working fluid working fluid in the interior chambers 104 of the heat pipe assemblies 204 to flow into the fins 212. In operation, heat from the coils 200 can vaporize the liquid phase of the working fluid in the porous wick lining 114 in the plates 208 of the interior portion 210 of the heat pipe assembly 204 that are adjacent to or otherwise in contact with the coils 200. The vaporized coolant can move in the portion of the interior chamber 104 that is in the interior portion 210 of the heat pipe assembly 204 to the portion of the interior chamber 104 that is in the exterior portion 208 of the heat pipe assembly 204.

The vaporized working fluid can condense in the portion of the interior chamber 104 that is in the exterior portion 208 of the heat pipe assembly 204. At least some of the vaporized working fluid can flow into the hollow fins 212 of the exterior portion 208 of the heat pipe assembly 204 to reduce the time needed for the vaporized working fluid to condense. This can rapidly cool the heat generated by the coils 200. The condensed working fluid can then flow back into the porous wick lining 114 in the interior portion 210 of the heat pipe assembly 204. As depicted, the heat pipe assembly 204 interfaces with the fins 212 consistent with an air-cooled arrangement. Optionally, the heat pipe assemblies 204 can interface with a liquid heat exchanger consistent with a liquid-cooled arrangement instead. In an alternative embodiment, the fins 212 can be separate entities and are attached to the heat pipe using epoxy, solder or a similar bonding operation ensuring thermal communication between the heat pipe body and fins.

Figure 5:
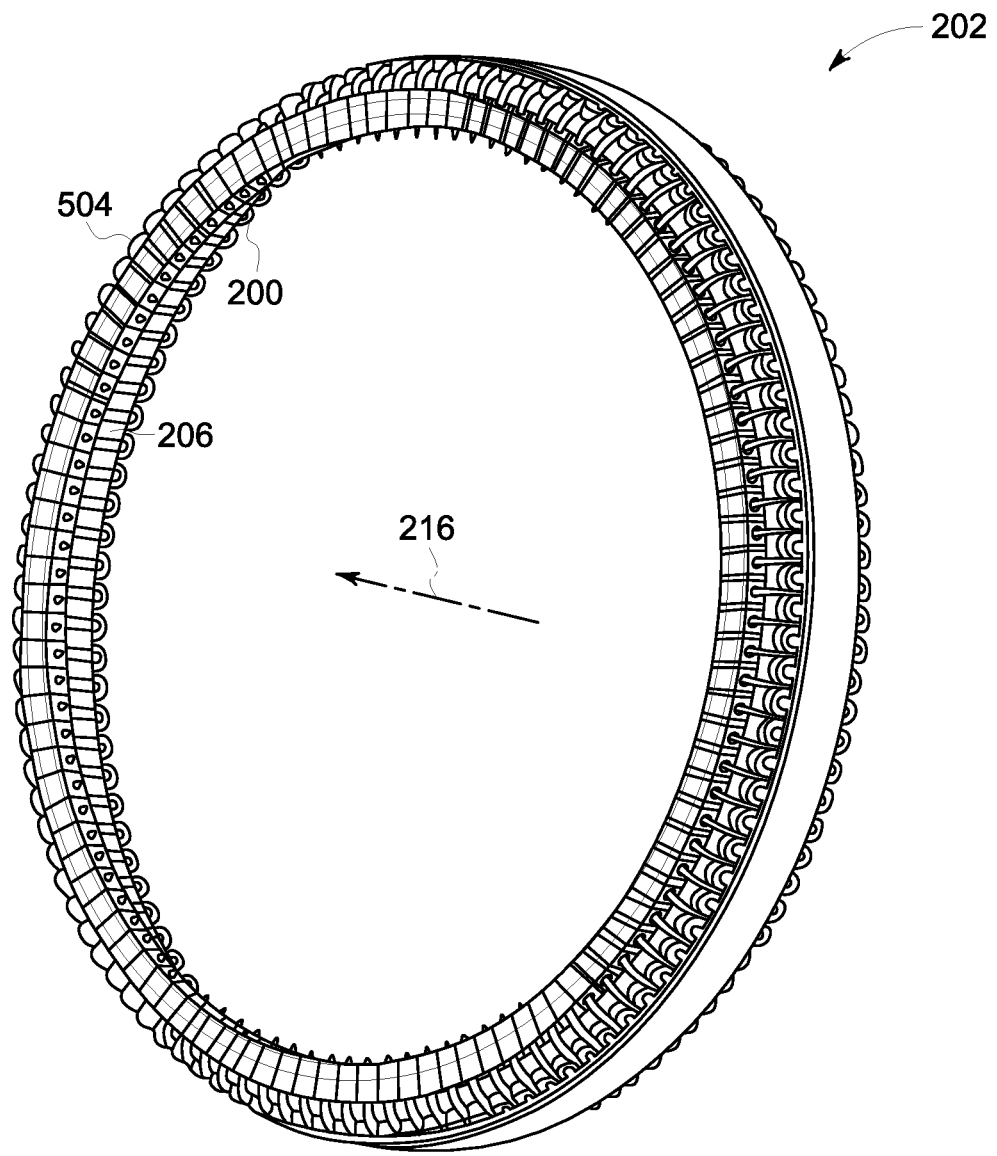
FIG. 5 illustrates a perspective view of the conductive coils of the motor shown in FIG. 2 with another embodiment of conformal heat pipe assemblies.
Figure 6:
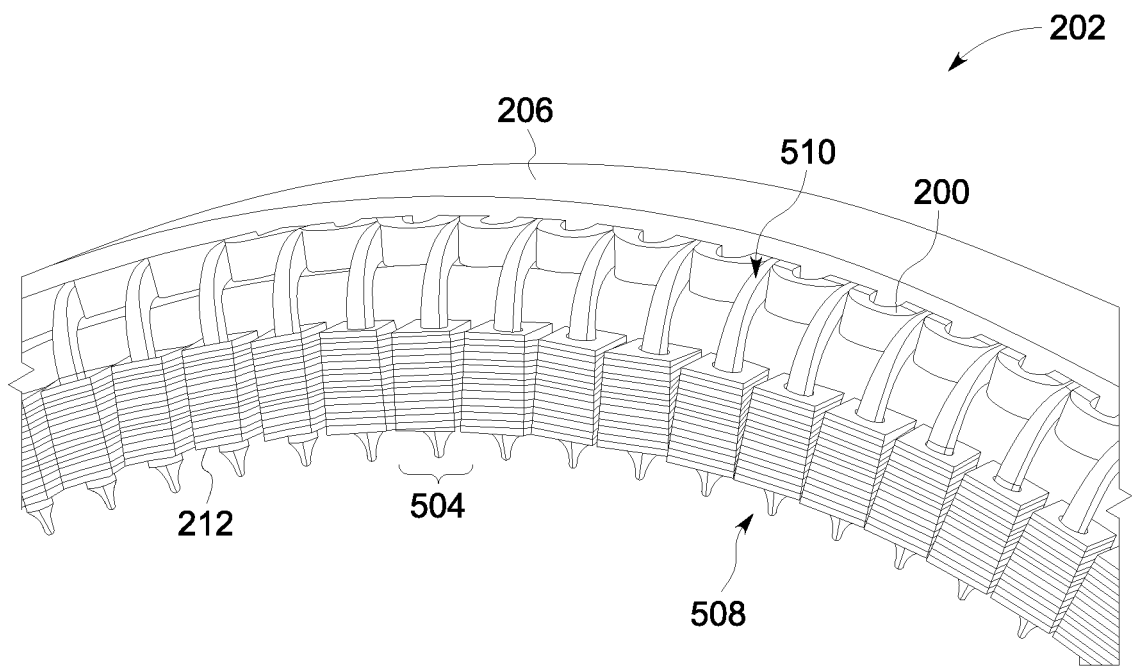
FIG. 6 is a perspective view of a portion of the conductive coils and heat pipe assemblies shown in FIG. 5.
Figure 7:
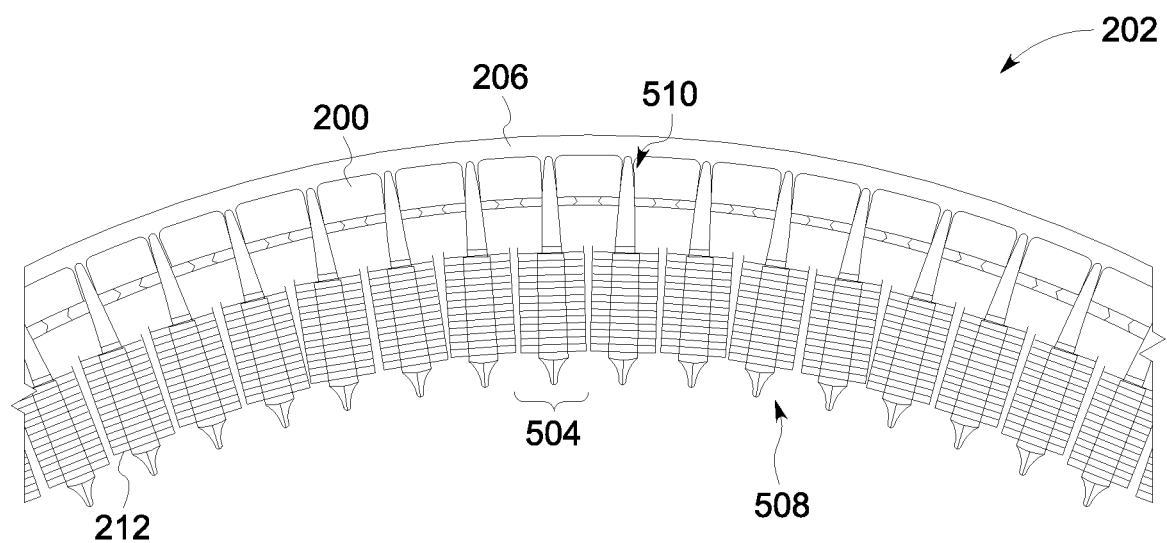
FIG. 7 is a front view of a portion of the conductive coils and heat pipe assemblies shown in FIG. 5.

FIG. 5 illustrates a perspective view of the conductive coils 200 of the motor 202 with another embodiment of conformal heat pipe assemblies 504. FIG. 6 is a perspective view of a portion of the conductive coils 200 and heat pipe assemblies 504. FIG. 7 is a front view of a portion of the conductive coils 200 and heat pipe assemblies 504.

The heat pipe assemblies 504 are L-shaped bodies in the illustrated embodiment. The heat pipe assemblies 504 include interior portions 510 that extend between neighboring coils 200 of the motor 202 and exterior portions 508 that are disposed outside of the coils 200 (e.g., are not located between the coils 200). The interior portions 510 are elongated in axial directions that are parallel to a center axis or axis of rotation 216 of the motor 502. The exterior portions 508 are elongated in radial directions that are perpendicular to the center axis or axis of rotation 216 of the motor 202. In the illustrated embodiment, the exterior portions 508 of the heat pipe assemblies 504 all are located on one side of the ring portion 206 of the stator of the motor 202. Additionally, the exterior portions of the heat pipe assemblies 504 all extend radially inward (e.g., toward the center axis or axis of rotation 216 of the motor 202) in the illustrated embodiment, in contrast to the heat pipe assemblies 204 shown in FIGS. 2 through 4.

The heat pipe assemblies 504 can include interior chambers 104 having porous wick linings 114 with working fluid therein, as shown in FIG. 1. The heat pipe assemblies 504 can help to rapidly cool the coils 200 by removing heat from the coils 200, as described above. For example, opposing walls 106, 108 in the interior portions 510 of the heat pipe assemblies 504 can be in direct contact with neighboring coils 200. Heat from the coils 200 vaporizes working fluid held in the porous wick linings 114 of the walls 106, 108, and the vapor working fluid then can move within the interior chambers 104 of the heat pipe assemblies 504 into the exterior portions 508 of the heat pipe assemblies 504 where there is less heat. At least some of the vapor working fluid can enter the fins 212 of the exterior portion 508 of the heat pipe assemblies 504, as described above. The vapor working fluid can then condense back into the liquid working fluid, which then flows or is pulled (e.g., via capillary action) back into the porous wick linings 114 of the interior portions 510.

Figure 8:
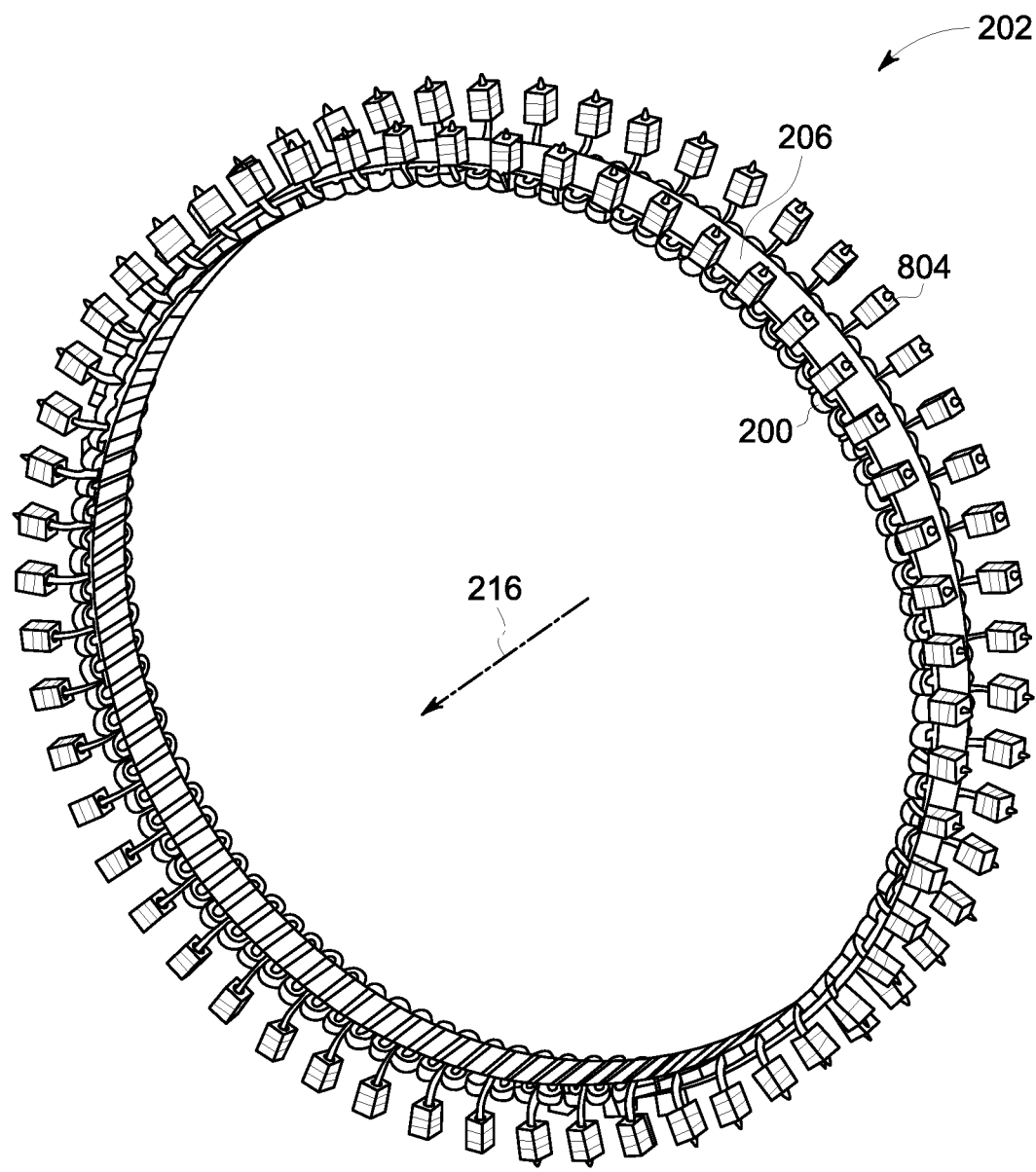
FIG. 8 illustrates a perspective view of the conductive coils of the motor shown in FIG. 2 with another embodiment of conformal heat pipe assemblies.

The walls 106, 108 of the interior portion 510 of each of the heat pipe assemblies 504 are in direct contact with the coils 200 that are on opposite sides of the heat pipe assembly 504, as shown in FIG. 8. For example, no additional material other than the material that forms the walls 106, 108 may be disposed between the wall 106 and/or 108 and the nearest coil 200.

Figure 9:
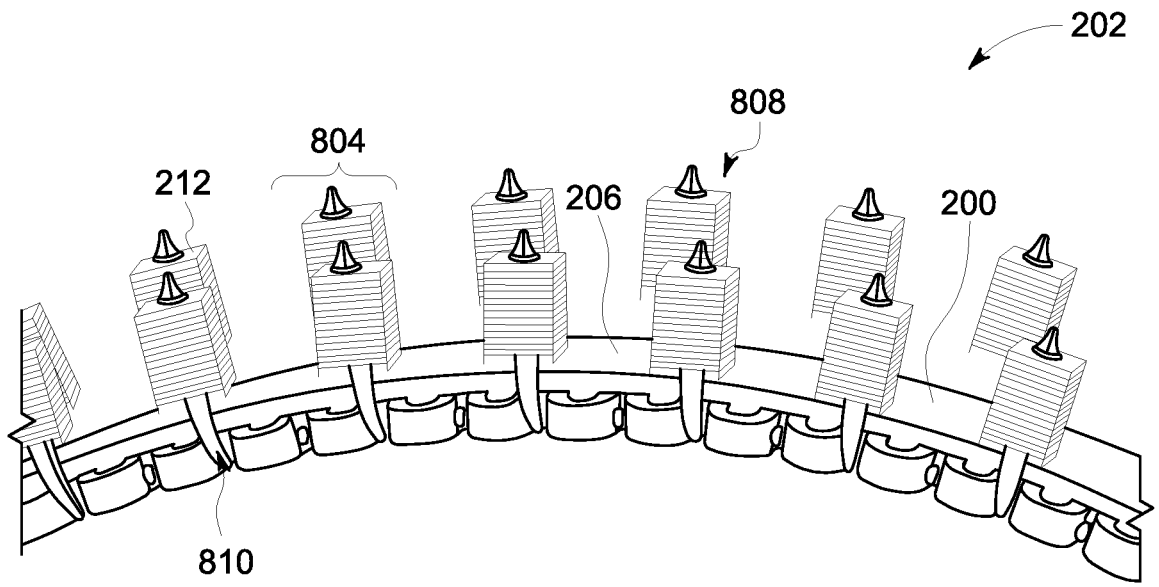
FIG. 9 is a perspective view of a portion of the conductive coils and heat pipe assemblies shown in FIG. 8.
Figure 10:
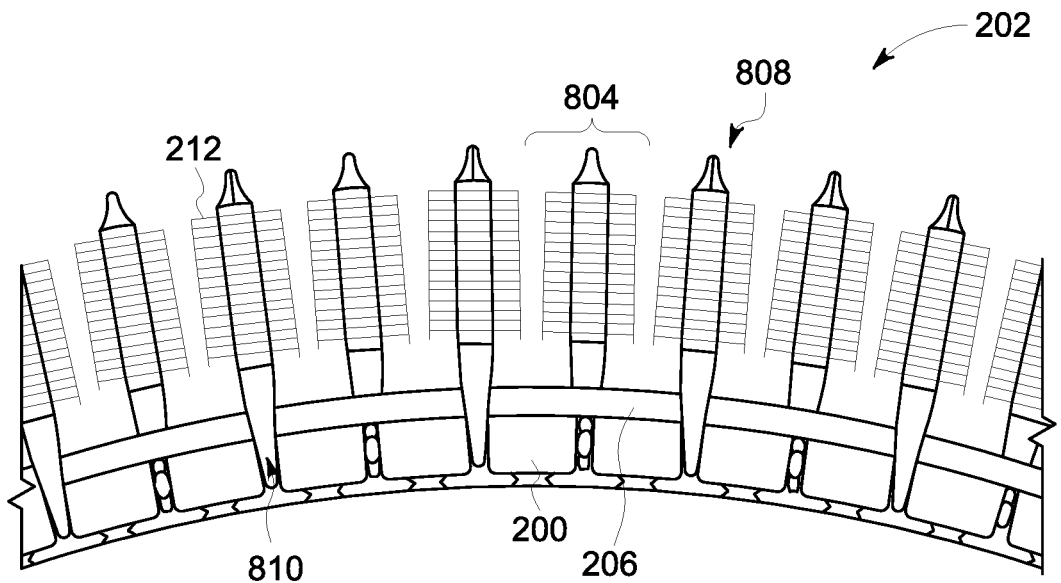
FIG. 10 is a front view of a portion of the conductive coils and heat pipe assemblies shown in FIG. 8.
Figure 11:
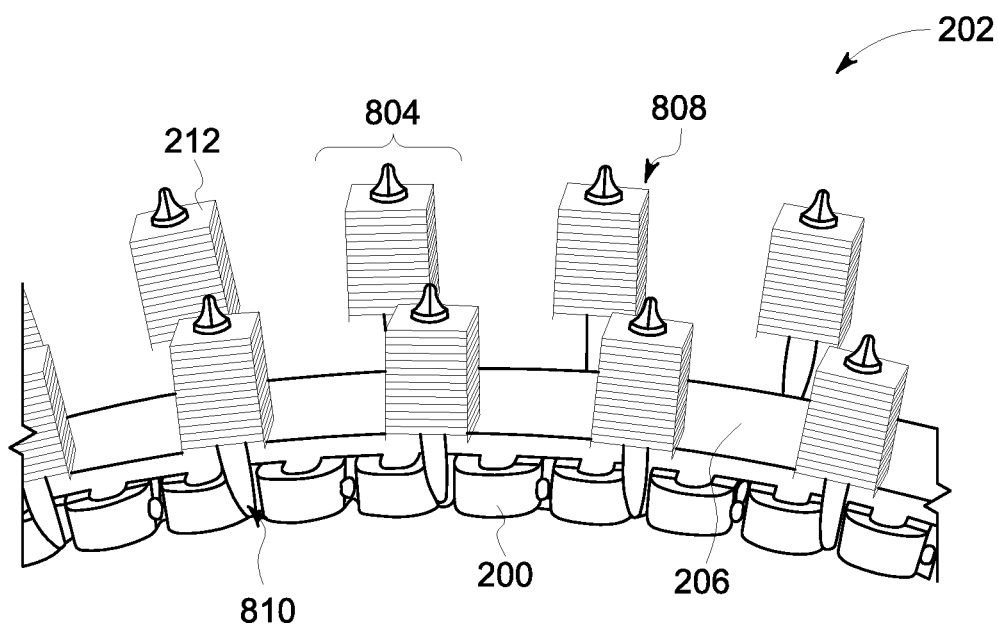
FIG. 11 is another perspective view of a portion of the conductive coils and heat pipe assemblies shown in FIG. 8.

FIG. 8 illustrates a perspective view of the conductive coils 200 of the motor 202 with another embodiment of conformal heat pipe assemblies 804. FIG. 9 is a perspective view of a portion of the conductive coils 200 and heat pipe assemblies 804. FIG. 10 is a front view of a portion of the conductive coils 200 and heat pipe assemblies 804. FIG. 11 is another perspective view of a portion of the conductive coils 200 and heat pipe assemblies 804.

The heat pipe assemblies 804 are L-shaped bodies in the illustrated embodiment. The heat pipe assemblies 804 include interior portions 810 that extend between neighboring coils 200 of the motor 202 and exterior portions 808 that are disposed outside of the coils 200 (e.g., are not located between the coils 200). The interior portions 810 are elongated in axial directions that are parallel to a center axis or axis of rotation 216 of the motor 502. The exterior portions 808 are elongated in radial directions that are perpendicular to the center axis or axis of rotation 216 of the motor 202. In the illustrated embodiment, the exterior portions 808 of the heat pipe assemblies 804 are located on opposite sides of the ring portion 206 of the stator of the motor 202. For example, the exterior portions 808 can alternate between the sides of the ring portion 206 such that heat pipe assemblies 804 that neighbor each other have exterior portions 808 on opposite sides of the ring portion 206. The heat pipe assemblies 804 that neighbor each other can have interior portions 810 that contact opposite sides of the same coil 200. Additionally, the exterior portions of the heat pipe assemblies 804 all extend radially outward (e.g., away from the center axis or axis of rotation 216 of the motor 202).

The heat pipe assemblies 804 can include interior chambers 104 having porous wick linings 114 with working fluid therein, as shown in FIG. 1. The heat pipe assemblies 804 can help to rapidly cool the coils 200 by removing heat from the coils 200, as described above. For example, opposing walls 106, 108 in the interior portions 810 of the heat pipe assemblies 804 can be in direct contact with neighboring coils 200. Heat from the coils 200 vaporizes working fluid held in the porous wick linings 114 of the walls 106, 108, and the vapor working fluid then can move within the interior chambers 104 of the heat pipe assemblies 804 into the exterior portions 808 of the heat pipe assemblies 804 where there is less heat. At least some of the vapor working fluid can enter the fins 212 of the exterior portion 808 of the heat pipe assemblies 804, as described above. The vapor working fluid can then condense back into the liquid working fluid, which then flows or is pulled (e.g., via capillary action) back into the porous wick linings 114 of the interior portions 810.

The walls 106, 108 of the interior portion 810 of each of the heat pipe assemblies 804 are in direct contact with the coils 200 that are on opposite sides of the heat pipe assembly 804, as shown in FIGS. 9, 10, and 11. For example, no additional material other than the material that forms the walls 106, 108 may be disposed between the wall 106 and/or 108 and the nearest coil 200.

Figure 12:
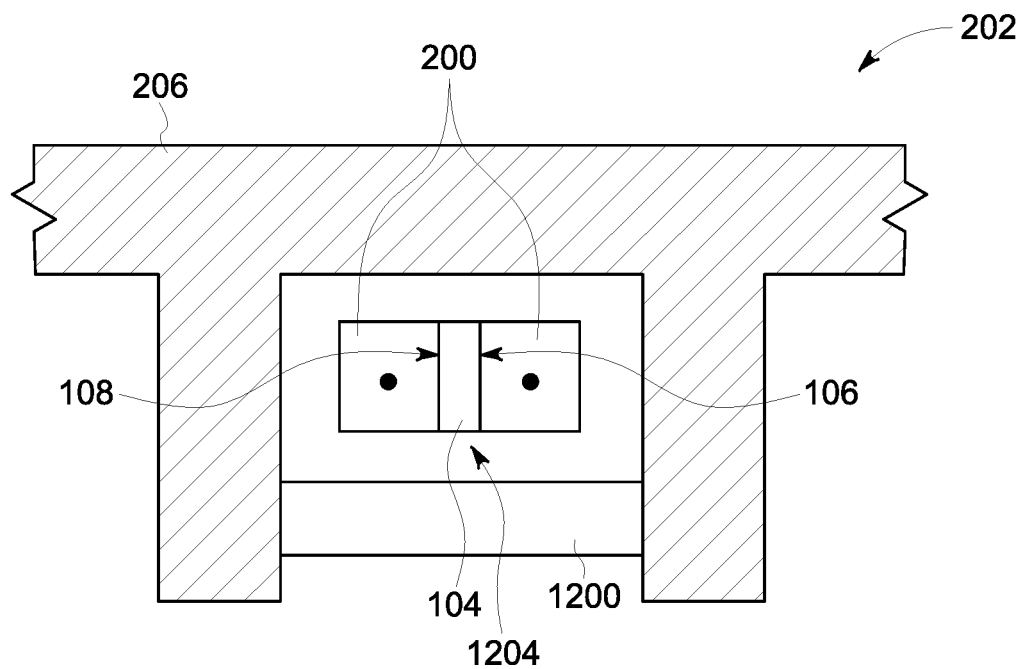
FIG. 12 illustrates a cross-sectional view of a coil of the motor shown in FIG. 2 and one embodiment of a heat pipe assembly.

FIG. 12 illustrates a cross-sectional view of a coil 200 of the motor 202 and one embodiment of a heat pipe assembly 1204. The cross-sectional view can represent a two-dimensional plane that is oriented perpendicular to the axis of rotation 216 of the motor 202. The motor 202 has the coils 200 arranged as concentrated windings in the illustrated embodiment. The heat pipe assembly 1204 can represent one or more of the heat sink assemblies 204, 504, 804 described above. The cross-sectional view of FIG. 12 only shows a cross-section of the interior portion of the heat pipe assembly 1204. As shown, the heat pipe assembly 1204 has the hollow interior chamber 104, with the walls 106, 108 being adjacent to and/or in contact with the coil 200. The interior portion of the heat pipe assembly 1204 has a rectangular cross-sectional shape in the illustrated embodiment. The ring portion 206 of the stator of the motor 202 optionally can include a topstick 1200, which can be magnetic or non-magnetic in different embodiments.

Figure 13:
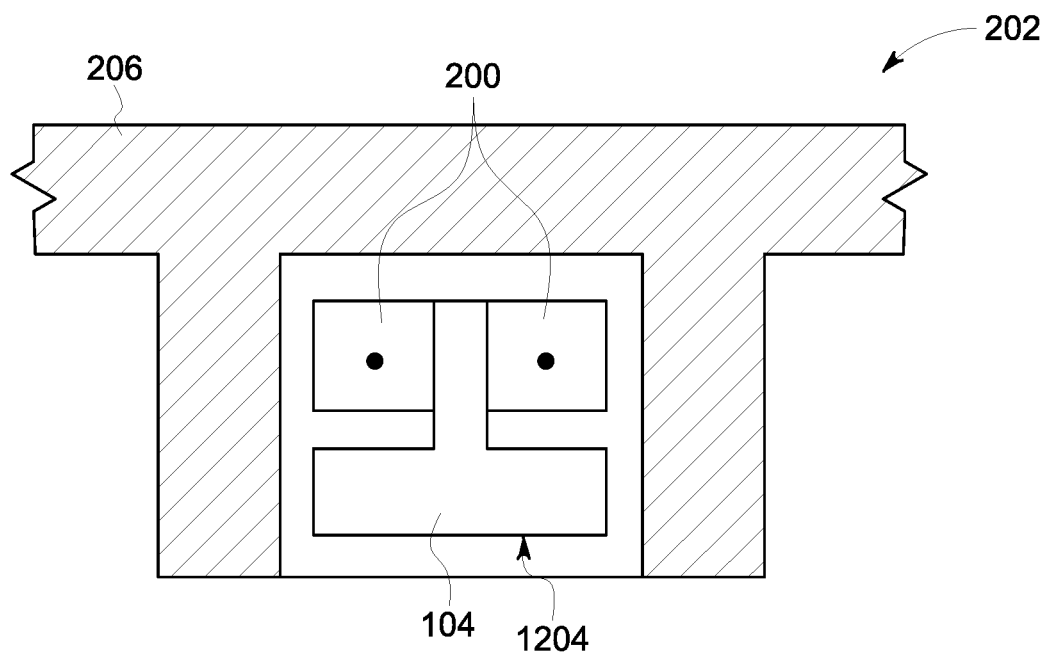
FIG. 13 illustrates a cross-sectional view of a coil of the motor shown in FIG. 2 and another embodiment of a heat pipe assembly.

FIG. 13 illustrates a cross-sectional view of a coil 200 of the motor 202 and another embodiment of a heat pipe assembly 1304. The cross-sectional view can represent a two-dimensional plane that is oriented perpendicular to the axis of rotation 216 of the motor 202. The motor 202 has the coils 200 arranged as concentrated windings in the illustrated embodiment. The heat pipe assembly 1304 can represent one or more of the heat sink assemblies 204, 504, 804 described above. The cross-sectional view of FIG. 13 only shows a cross-section of the interior portion of the heat pipe assembly 1304. As shown, the heat pipe assembly 1304 has the hollow interior chamber 104, with walls of the assembly 1304 being adjacent to and/or in contact with the coil 200. The interior portion of the heat pipe assembly 1304 has a T-shaped cross-sectional shape in the illustrated embodiment. This shape provides for a radial portion 1300 of the interior chamber 104 being elongated in a direction that is perpendicular to the axis of rotation 216 and a circumferential portion 1302 of the interior chamber 104 being elongated in a direction that encircles or that otherwise does not intersect the axis of rotation 216. For example, the interior chamber 104 can be elongated in an orthogonal direction to the axis of rotation 216. This shape of the heat pipe assembly 1304 can provide for more contact between the coil 200 and the heat pipe assembly 1304 relative to the embodiment shown in FIG. 12. This can result in heat being more rapidly transferred from the coil 200 to the heat pipe assembly 1304 to more rapidly cool the coil 200. Optionally, the heat pipe assembly 1304 can operate as an integrated topstick of the motor.

Figure 14:
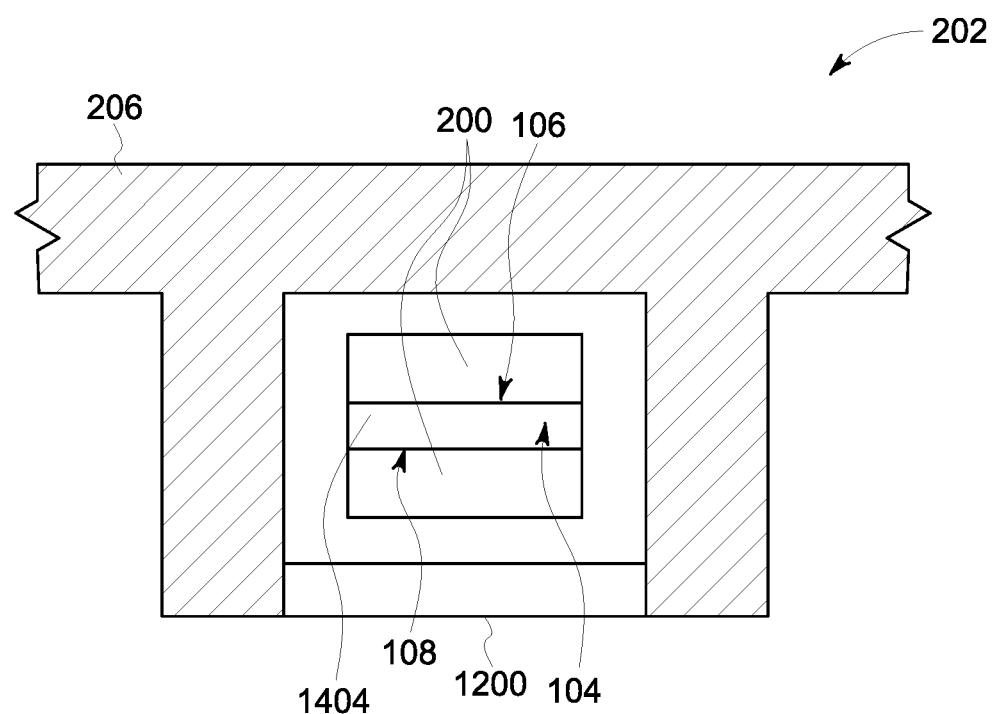
FIG. 14 illustrates a cross-sectional view of a coil of the motor shown in FIG. 2 and another embodiment of a heat pipe assembly.

FIG. 14 illustrates a cross-sectional view of a coil 200 of the motor 202 and another embodiment of a heat pipe assembly 1404. The cross-sectional view can represent a two-dimensional plane that is oriented perpendicular to the axis of rotation 216 of the motor 202. The motor 202 has the coils 200 arranged as distributed windings in the illustrated embodiment. The ring portion 206 of the stator of the motor 202 optionally can include the topstick 1200 described above.

The heat pipe assembly 1404 can represent one or more of the heat sink assemblies 204, 504, 804 described above. The cross-sectional view of FIG. 14 only shows a cross-section of the interior portion of the heat pipe assembly 1404. As shown, the heat pipe assembly 1404 has the hollow interior chamber 104, with the walls 106, 108 of the assembly 1404 being adjacent to and/or in contact with the coil 200. The interior portion of the heat pipe assembly 1404 has a rectangular cross-sectional shape in the illustrated embodiment. While the interior portion of the heat pipe assembly 1204 shown in FIG. 12 is elongated in a direction that radially extends toward or away from the axis of rotation 216 of the motor 202, the interior portion of the heat pipe assembly 1404 is elongated in a circumferential direction that encircles the axis 216.

Figure 15:
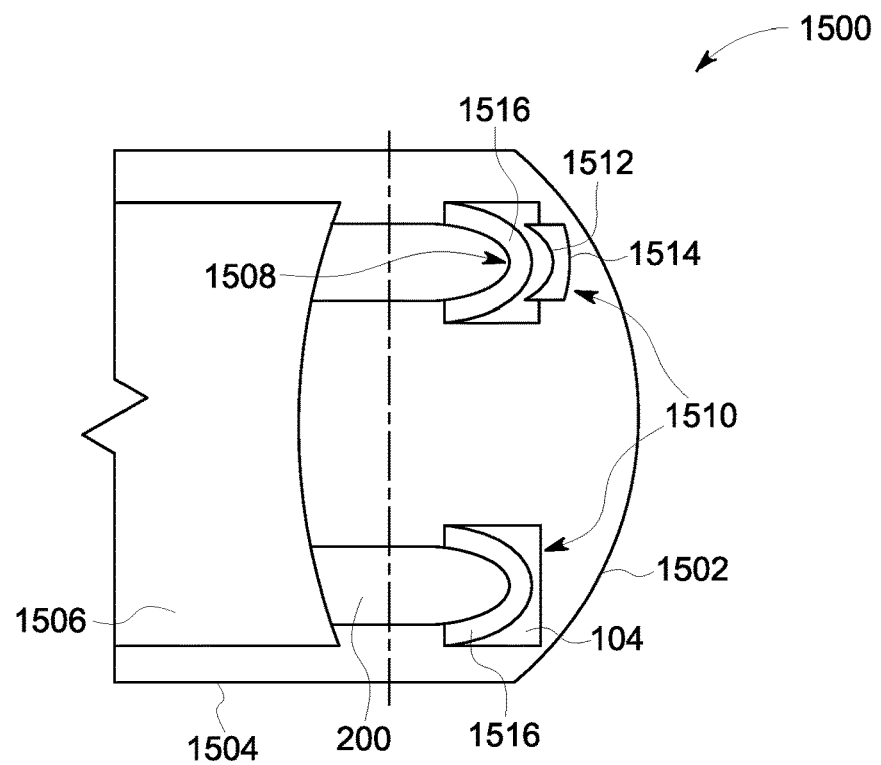
FIG. 15 illustrates one embodiment of an end bell conformal heat pipe assembly.

FIG. 15 illustrates one embodiment of an end bell conformal heat pipe assembly 1500. The heat pipe assembly 1500 is formed into or is formed as an end bell 1502 that couples with the motor 202. The end bell 1502 couples with a stator housing 1504 of a stator 1506 of the motor 202. The end bell 1502 includes recesses 1508 having shapes that conform to the shapes of the coils 200 of the motor 202. For example, the recesses 1508 may have U-shapes or other concave shapes that separately receive the separate coils 200 of the motor 202.

The end bell 1502 can be formed (e.g., using additive manufacturing) to include heat sink assemblies 1510 in the end bell 1502. The assemblies 1510 can be shaped to match the curved shape of the coils 200, as shown in FIG. 15. For example, the convex shapes of the coils 200 can extend into the concave shapes of the assemblies 1510. These assemblies 1510 include the interior chamber 104 that is defined and enclosed by the interior porous wick linings described above. For example, one curved wall 1512 of the assembly 1510 can be an evaporator wall of the assembly 1510 that includes a porous wick lining and an opposite curved or flat wall 1514 of the assembly 1510 can be a condenser wall that includes another porous wick lining. The end bell 1502 optionally can include a gap pad 1516, which can be a flexible, thermally conductive material that engages the coils 200. This gap pad 1516 can engage the coils 200 without imparting mechanical damage to the end turns of the coils 200 (e.g., the visible portions of the coils 200 in FIG. 15), while also thermally conducting heat from the coils 200 to the assembly 1510.

In operation, heat from the end turns of the coils 200 is received by the evaporator walls 1512 of the assemblies 1510. This heat evaporates liquid working fluid in the porous wick linings of the evaporator walls 1512. The vaporized working fluid moves toward the condenser wall 1514, where the working fluid condenses to form liquid working fluid. Heat from the end turns of the coils 200 is drawn out from the coils 200 by this evaporation and condensation. The heat pipe assembly 1500 that is formed into the end bell 1502 of the motor 202 can be used alone or in combination with one or more other heat pipe assemblies described herein to rapidly cool the conductive coils of a motor.

Figure 16:
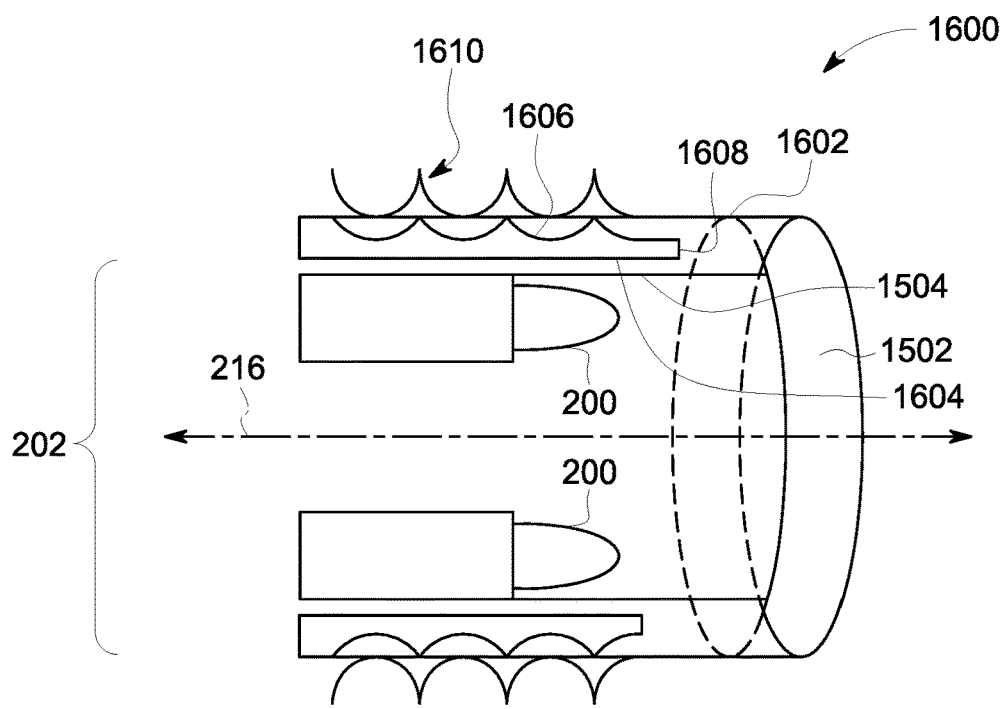
FIG. 16 illustrates a first cross-sectional view of one embodiment of a motor housing heat pipe assembly.
Figure 17:
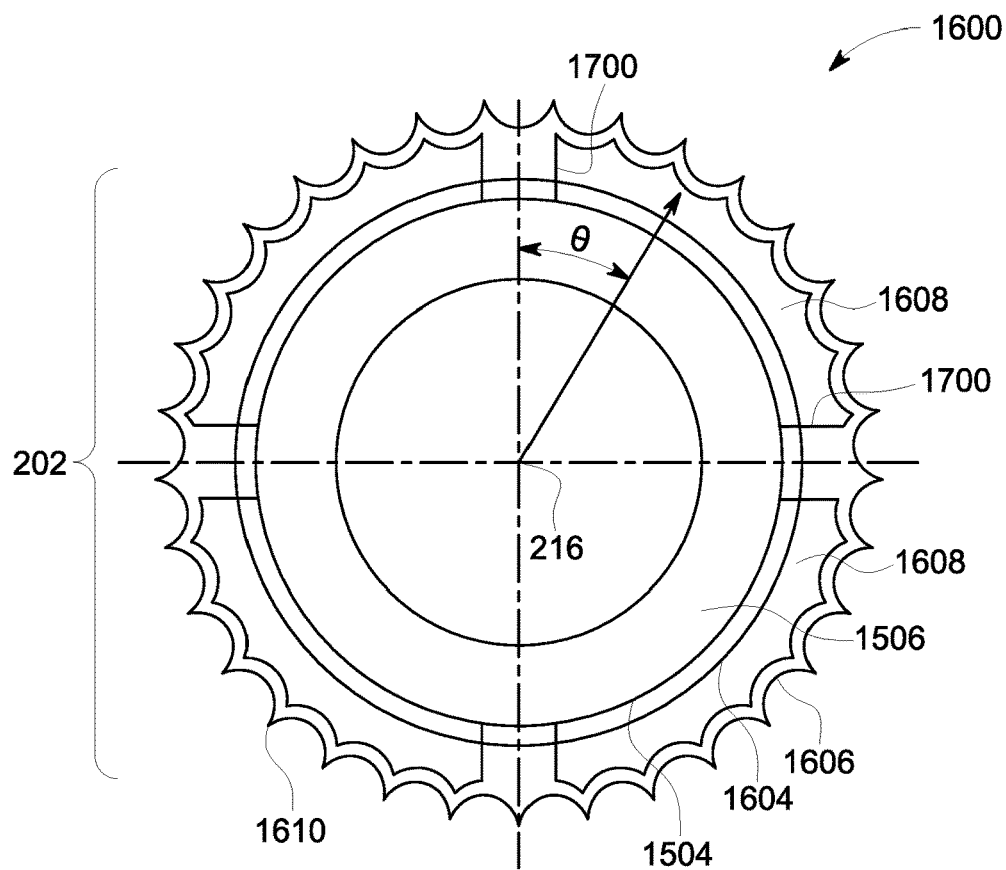
FIG. 17 illustrates a second cross-sectional view of the motor housing heat pipe assembly shown in FIG. 16.

FIG. 16 illustrates a first cross-sectional view of one embodiment of a motor housing heat pipe assembly 1600. FIG. 17 illustrates a second cross-sectional view of the motor housing heat pipe assembly 1600. The view shown in FIG. 16 is along a two-dimensional plane that is parallel to or that includes the axis of rotation 216 of the motor 202. The view shown in FIG. 17 is along another two-dimensional plane that is perpendicular to the axis of rotation 216. As shown, the motor 202 can include the end bell 1502. Optionally, this end bell 1502 can be formed as the end bell conformal heat pipe assembly 1500 described above.

The heat pipe assembly 1600 is formed into or is formed as an outer housing 1602 of the motor 202. The heat pipe assembly 1600 can be formed using additive manufacturing. The heat pipe assembly 1600 can be used to cool the motor 202, and can be used in combination with one or more of the other heat pipe assemblies described herein. The housing 1602 includes an interior wall 1604 and an opposite wall 1606 with a sealed interior chamber 1608 between the walls 1604, 1606. The walls 1604, 1606 can include the porous wick linings described herein. A working fluid can be disposed inside the chamber 1608 and/or the pores of the walls 1604, 1606.

The interior wall 1604 can be directly adjacent to the stator housing 1504 to cool the stator housing 1504. The opposite wall 1606 optionally includes elongated fins 1610 that outwardly project away from the stator housing 1504. The fins 1610 can be hollow extensions of the interior chamber 1608 such that the working fluid can flow inside the fins 1610. In operation, the heat from the stator housing 1504 evaporates liquid working fluid in the pores of the porous lining of the wall 1604. The vaporized working fluid radially flows away from the wall 1604 inward into the interior chamber 1608 and optionally toward the portions of the interior chamber 1608 that are inside the fins 1610. The fins 1610 permit the vaporized working fluid to move farther away from the source of heat (e.g., the motor), and providing several fins 1610 allows smaller portions of the vaporized working fluid to be separately cooled. These features can permit the vaporized working fluid to rapidly condense by transferring the heat from the motor 202 outside of the assembly 1600, and thereby rapidly cool the motor 202.

As shown in FIG. 17, the heat pipe assembly 1600 optionally can include one or more support posts 1700. The posts 1700 are structural members that assist in separating the walls 1604, 1606 from each other by mechanically supporting the wall 1606 outside of the wall 1604. The posts 1700 can be formed from the same materials and/or formed using additive manufacturing. Optionally, the posts 1700 can divide the interior chamber 1608 up into several, smaller chambers 1608. The posts 1700 can include a porous wick lining 114 to aid in moving the condensed working fluid back from the side where the fluid condenses to the side where the fluid evaporates upon exposure to heat.

Figure 18:
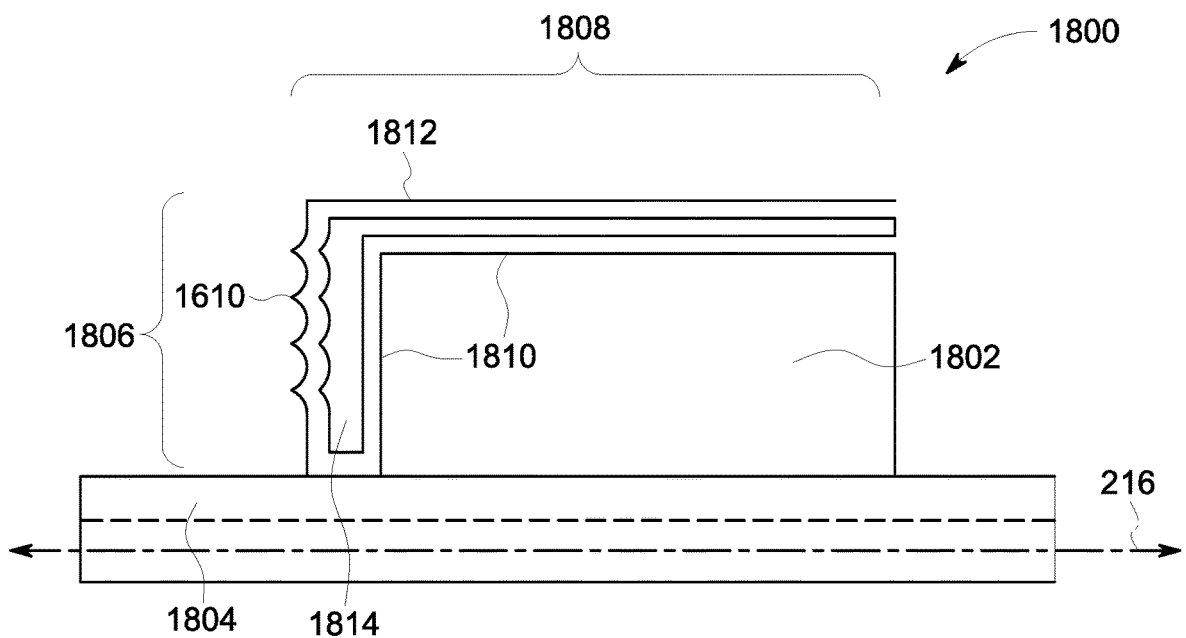
FIG. 18 illustrates a first cross-sectional view of one embodiment of a rotor sleeve heat pipe assembly.
Figure 19:
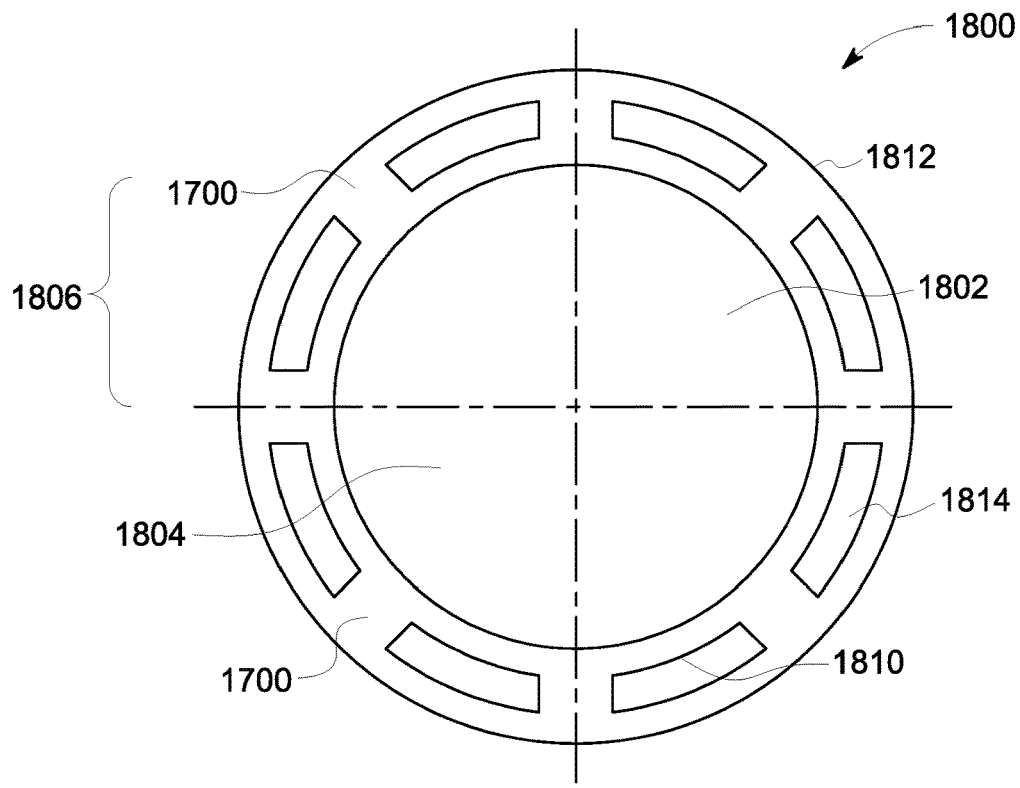
FIG. 19 illustrates a second cross-sectional view of the rotor sleeve heat pipe assembly shown in FIG. 18.

FIG. 18 illustrates a first cross-sectional view of one embodiment of a rotor sleeve heat pipe assembly 1800. FIG. 19 illustrates a second cross-sectional view of the rotor sleeve heat pipe assembly 1800. The view shown in FIG. 18 is along a two-dimensional plane that is parallel to or that includes the axis of rotation 216 of the motor 202. The view shown in FIG. 19 is along another two-dimensional plane that is perpendicular to the axis of rotation 216. A rotor 1802 of the motor 202 (shown in FIG. 16) is disposed inside the stator 1506 (shown in FIG. 15). The rotor 1802 is coupled with an elongated shaft 1804, and both the rotor 1802 and the shaft 1804 rotate around or about the axis of rotation 216.

The heat pipe assembly 1800 can be formed as a sleeve and/or end plate on the rotor 1802. The heat pipe assembly 1800 can be disposed between the rotor 1802 and the stator 1506 to cool the rotor 1802 and optionally the stator 1506. The heat pipe assembly 1800 includes a sleeve portion 1808 and an end plate portion 1806. The sleeve portion 1808 is elongated in directions that are parallel to the axis 216, while the end plate portion 1806 is elongated in directions that are perpendicular to the axis 216. The end plate portion 1806 can be formed as a circular plate with an opening through which the shaft 1804 extends. In FIG. 18, only one half of the sleeve and end plate portions 1808, 1806 is shown.

The heat pipe assembly 1800 can be formed using additive manufacturing. The heat pipe assembly 1800 can be used to cool the rotor 1802, and can be used in combination with one or more of the other heat pipe assemblies described herein. The portions 1806, 1808 of the heat pipe assembly 1800 include an interior wall 1810 and an opposite wall 1812 with a sealed interior chamber 1814 between the walls 1810, 1812. The walls 1810, 1812 can include the porous wick linings described herein. A working fluid can be disposed inside the chamber 1814 and/or the pores of the walls 1810, 1812.

The interior wall 1810 can be directly adjacent to the exterior surfaces of the rotor 1802, as shown in FIG. 18. The end plate portion 1806 optionally includes elongated fins 1610 that outwardly project away from the outer wall 1812 of the end plate portion 1806. As described above, the fins 1610 can be hollow extensions of the interior chamber 1814 such that the working fluid can flow inside the fins 1610. In operation, the heat from the rotor 1802 evaporates liquid working fluid in the pores of the porous lining of the wall 1810. The vaporized working fluid radially flows (in the sleeve portion 1808) and axially flows (in the end plate portion 1806) away from the wall 1810 toward the portions of the interior chamber 1814 and optionally toward the portions of the interior chamber 1814 that are inside the fins 1610. The vaporized working fluid can then condense and return to the pores in the wall 1810. In one embodiment, centrifugal forces can assist in returning the working fluid to the side of the heat pipe assembly where evaporation of the working fluid occurs.

As shown in FIG. 19, the heat pipe assembly 1800 optionally can include one or more support posts 1700. As described above, the posts 1700 are structural members that assist in separating the walls 1810, 1812 from each other by mechanically supporting the wall 1812 outside of the wall 1810. The posts 1700 can be formed from the same materials and/or formed using additive manufacturing. Optionally, the posts 1700 can divide the interior chamber 1814 up into several, smaller chambers 1814.

Figure 20:
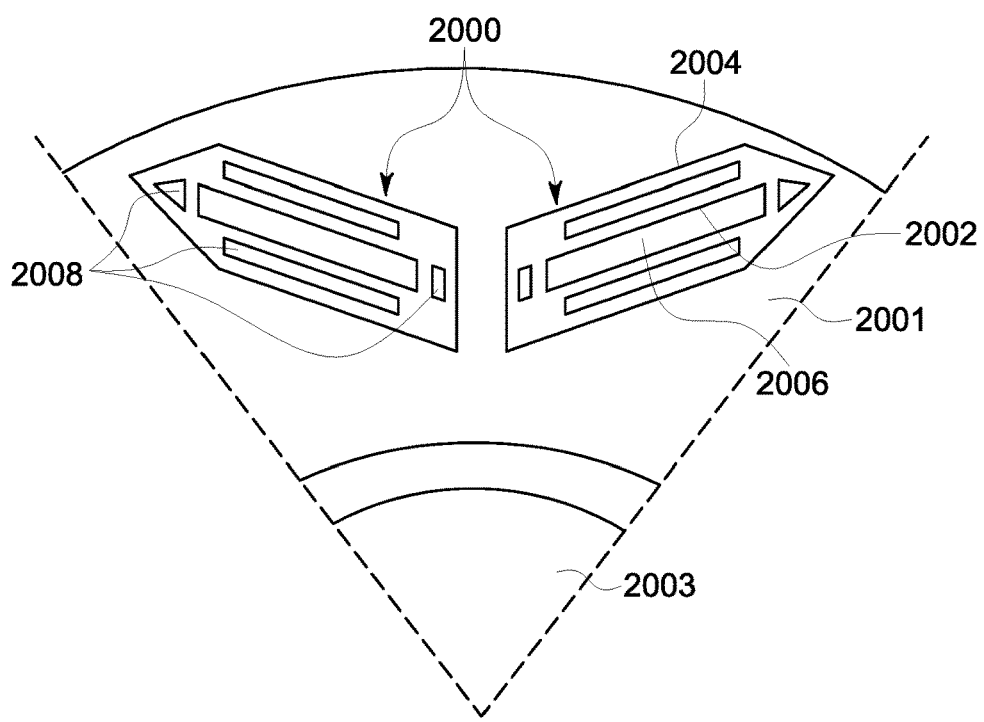
FIG. 20 illustrates a cross-sectional view of one embodiment of a rotor heat pipe assembly for an interior permanent magnet motor.

FIG. 20 illustrates a cross-sectional view of one embodiment of a rotor heat pipe assembly 2000 for an interior permanent magnet motor. The view shown in FIG. 20 is along a two-dimensional plane that is perpendicular to the axis of rotation of the rotor of the interior permanent magnet motor. Only a portion of a rotor 2001 and shaft 2003 of the interior permanent magnet motor is shown in FIG. 20.

The heat pipe assembly 2000 is formed as a rectangular box in which a permanent magnet 2006 of the interior permanent magnet motor is placed. Several heat pipe assemblies 2000 can be provided, such as one assembly 2000 for each permanent magnet in the interior permanent magnet motor. The heat pipe assembly 2000 can be formed using additive manufacturing. The heat pipe assembly 2000 can be used to cool the magnets 2006. The heat pipe assembly 2000 includes an interior wall 2002 and an opposite wall 2004 with a sealed interior chamber 2006 between the walls 2002, 2004. The walls 2002, 2004 can include the porous wick linings described herein. A working fluid can be disposed inside the chamber 2006 and/or the pores of the walls 2002, 2004.

The interior wall 2002 can be directly adjacent to the exterior surfaces of the magnet 2006. In operation, the heat from the magnet 2006 evaporates liquid working fluid in the pores of the porous lining of the interior wall 2002. The vaporized working fluid radially flows away from the interior wall 2002 toward the interior chamber 2008 and the outer wall 2004. This can help draw heat away from and cool the magnet 2006. The vaporized working fluid can condense and return to the interior wall 2002, as described herein.

Figure 21:
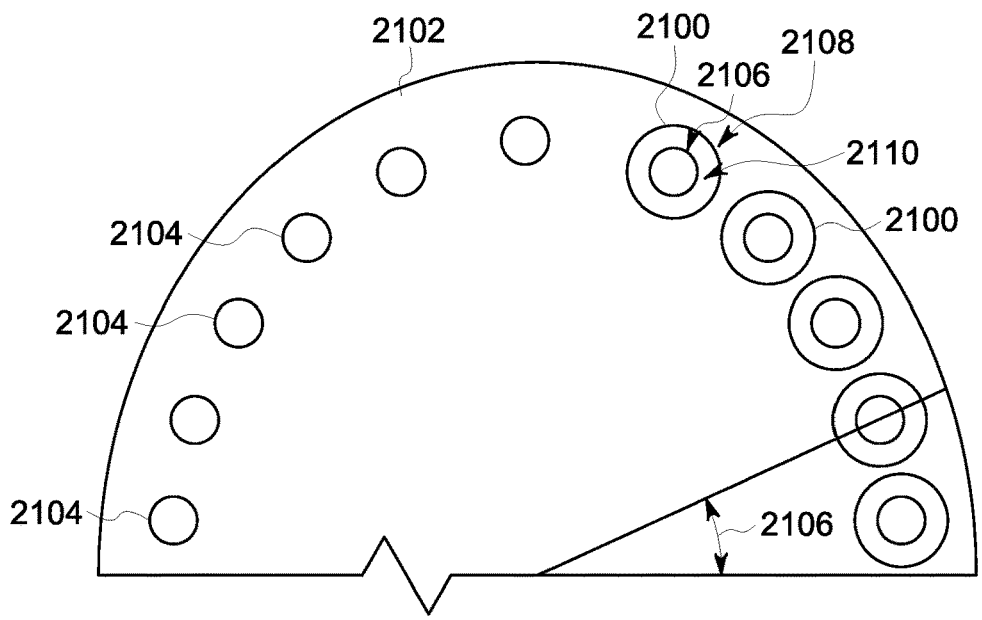
FIG. 21 illustrates a cross-sectional view of one embodiment of a rotor heat pipe assembly for an induction motor of a field wound motor.

FIG. 21 illustrates a cross-sectional view of one embodiment of a rotor heat pipe assembly 2100 for an induction motor of a field wound motor. The view shown in FIG. 21 is along a two-dimensional plane that is perpendicular to an axis of rotation 2126 of the rotor 2102 of the induction motor. Only a portion of a rotor 2102 is shown in FIG. 21.

The rotor 2102 includes several conductive rods or bars 2104 that are elongated in directions that are parallel to the axis of rotation 2126 of the rotor 2102. This axis 2126 is oriented perpendicular to the view of FIG. 21 (e.g., into and out of the page of FIG. 21). These bars 2104 are placed in openings in the rotor 2102. Several heat pipe assemblies 2100 can be formed around the bars 2104. The heat pipe assemblies 2100 can be in direct contact with the bars 2104. For example, each heat pipe assembly 2100 can be formed as a cylindrical sleeve in which one of the bars 2104 are positioned, with the heat pipe assembly 2100 and the bar 2104 placed into an opening in the rotor 2102, as shown in FIG. 21.

The heat pipe assemblies 2100 can be formed using additive manufacturing. The heat pipe assemblies 2100 can be used to cool the bars 2104, which can heat up during operation due to the changing magnetic field to which the bars 2104 are exposed to rotate the rotor 2102. Although only five of the bars 2104 are shown as including a heat pipe assembly 2100, optionally, a different number or all the bars 2104 can be provided with a heat pipe assembly 2100.

Each of the heat pipe assemblies 2100 can include an interior wall 2106 and an opposite outer wall 2108 with a sealed interior chamber 2110 between the walls 2106, 2108. The walls 2106, 2108 can include the porous wick linings described herein. A working fluid can be disposed inside the chamber 2110 and/or the pores of the walls 2106, 2108. The interior wall 2106 can be directly adjacent to the exterior surfaces of the bar 2104. In operation, the heat from the bar 2104 evaporates liquid working fluid in the pores of the porous lining of the interior wall 2106. The vaporized working fluid radially flows away from the interior wall 2106 toward the interior chamber 2110 and the outer wall 2108. This can help draw heat away from and cool the bar 2104. The vaporized working fluid can condense and return to the interior wall 2106, as described herein.

Figure 22:
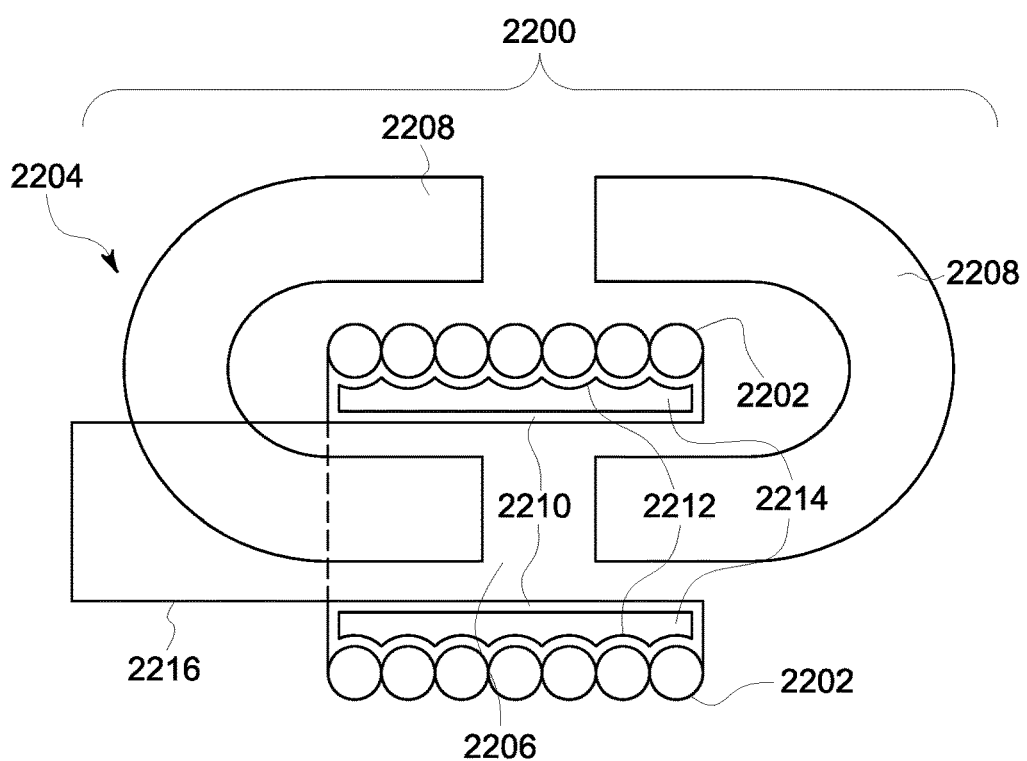
FIG. 22 illustrates a cross-sectional view of one embodiment of a transformer windings or inductor windings heat pipe assembly.

FIG. 22 illustrates a cross-sectional view of one embodiment of a transformer windings or inductor windings heat pipe assembly 2200. The heat pipe assembly 2200 can be used to cool conductive windings 2202 of a transformer or inductor device 2204. The windings 2202 can be helically wrapped around a bobbin 2206, and the heat pipe assembly 2200 can be at least partially located between the windings 2202 and the bobbin 2206. A magnetic core 2208 of the device 2204 is positioned such that the windings 2202 extend around opposing sections of the magnetic core 2208 that are separated by an insulative gap. Alternatively, the heat pipe assembly 2200 can form the bobbin 2206. For example, the heat pipe assembly 2200 can be formed as a cylindrical body about which the windings 2202 are wrapped.

As shown, the heat pipe assembly 2200 can be formed to include ridges 2201 that radially extend away from a center axis of the heat pipe assembly 2200 or bobbin 2206. These ridges can be sized and positioned to receive different windings 2202. The ridges increase the surface area where the windings 2202 engage the heat pipe assembly 2200, which can increase the rate at which heat is thermally transferred from the windings 2202 to the heat pipe assembly 2200. The ridges optionally can provide a guide for where the windings 2202 are to be positioned during manufacture of the transformer.

In operation, the windings 2202 can become heated due to the varying magnetic field that is generated around the core 2208 from the passage of current through the windings 2202. The heat pipe assembly 2200 can help to cool these windings 2202. The heat pipe assembly 2200 can wrap around the bobbin 2206 between the windings 2202 and the bobbin 2206. The heat pipe assembly 2200 includes opposing inner and outer walls 2210, 2212, with a sealed interior chamber 2214 located between the walls 2210, 2212. The walls 2210, 2212 can include the porous wick linings 114, as described herein, with a working fluid in the pores of the linings 114 and the chamber 2214. The walls 2212 may be in direct contact with the windings 2202. For example, there may not be any other material between the walls 2212 and the windings 2202.

The heat pipe assembly 2200 also can include a chamber extension 2216, which is an extension of the interior chamber 2214 that is not disposed between the windings 2202 and the bobbin 2206. In the illustrated embodiment, this extension 2216 is formed by portions of the walls 2210, 2212 and the chamber 2214 that extend along the length of the bobbin 2206 outside of the windings 2202, as shown in FIG. 22. The walls 2210, 2212 can encircle the bobbin 2206 such that the heat pipe assembly 2200 forms a cylindrical sleeve in which the bobbin 2206 is disposed. The chamber extension 2216 can be part of this cylindrical sleeve that extends outside of the windings 2202.

The heat pipe assemblies 2200 can be formed using additive manufacturing. The heat pipe assemblies 2200 can be used to cool the windings 2202, which can heat up during operation of the device 2204. In operation, the heat from the windings 2202 evaporates liquid working fluid in the pores of the porous lining of the wall 2212 and potentially in the pores of the wall 2210. The vaporized working fluid axially flows in the chamber 2214 in directions along the length of the bobbin 2206 toward the chamber extension 2216. For example, the vaporized working fluid increases the gas pressure inside the chamber 2214 in locations between the windings 2202 and the bobbin 2206. This increased pressure can cause the vaporized working fluid to flow in the chamber 2214 along the length of the bobbin 2206 toward the chamber extension 2216.

The temperature inside the chamber extension 2216 may be reduced relative to the temperature inside the chamber 2214 between the windings 2202 and the bobbin 2206. This can be due to the heated windings 2202 being farther from the chamber extension 2216. The cooler temperatures in the chamber extension 2216 can cause the vaporized working fluid to condense, which transfers thermal energy out of the heat pipe assembly 2200 and helps to cool the windings 2202. The liquid working fluid can then flow back into the pores of the walls 2210, 2212 and into the chamber 2214 in locations between the windings 2202 and the bobbin 2206 to continue cooling the windings 2202.

Figure 23:
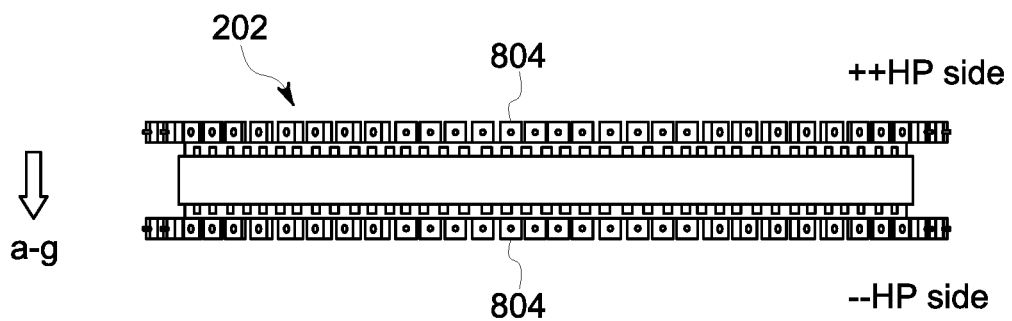
FIG. 23 illustrates operation of one or more of the heat pipe assemblies shown in FIG. 8 in the motor shown in FIG. 2 that is disposed on a moving system.
Figure 24:
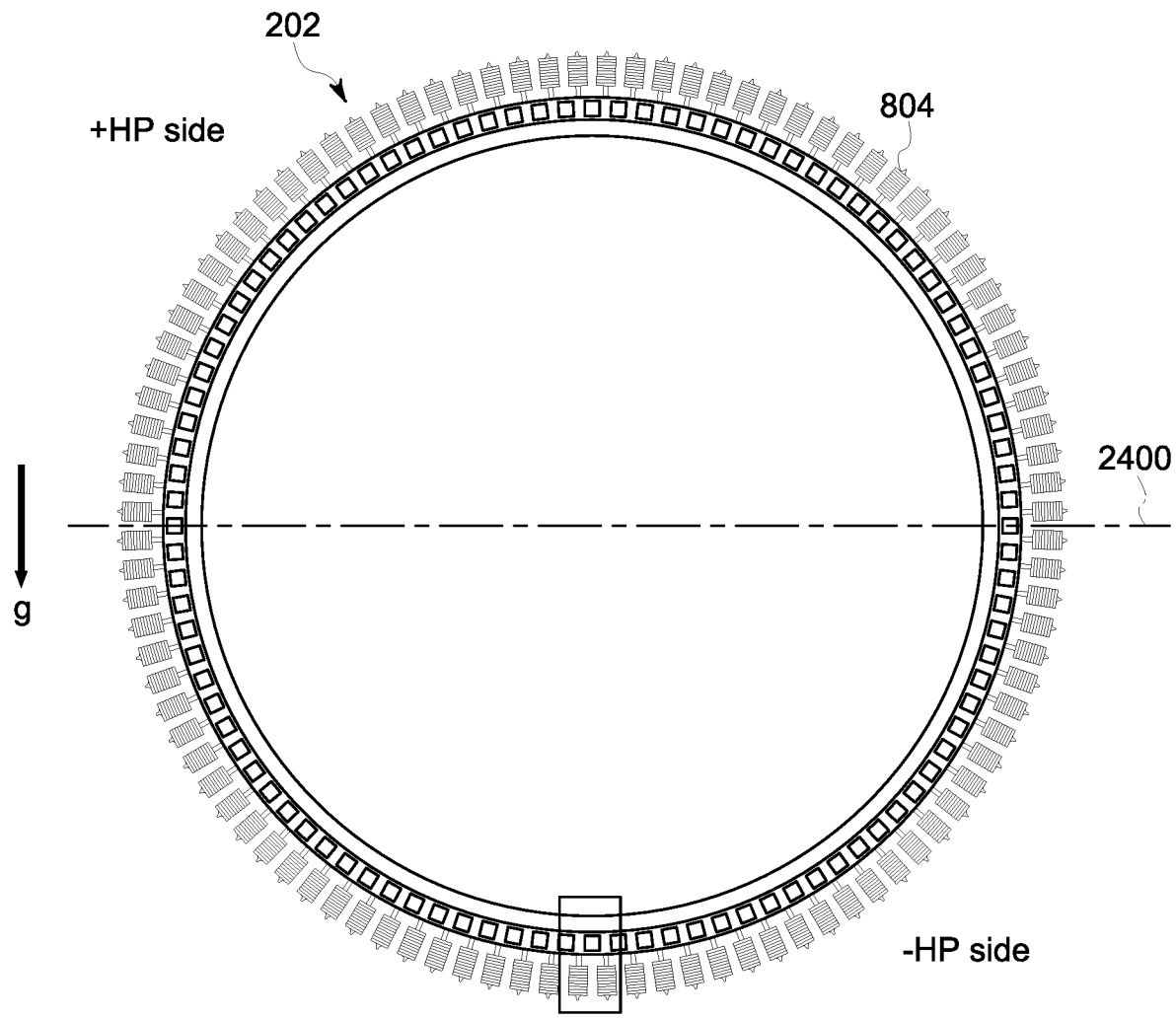
FIG. 24 also illustrates operation of one or more of the heat pipe assemblies shown in FIG. 8 in the motor shown in FIG. 2 that is disposed on the moving system.
Figure 25:
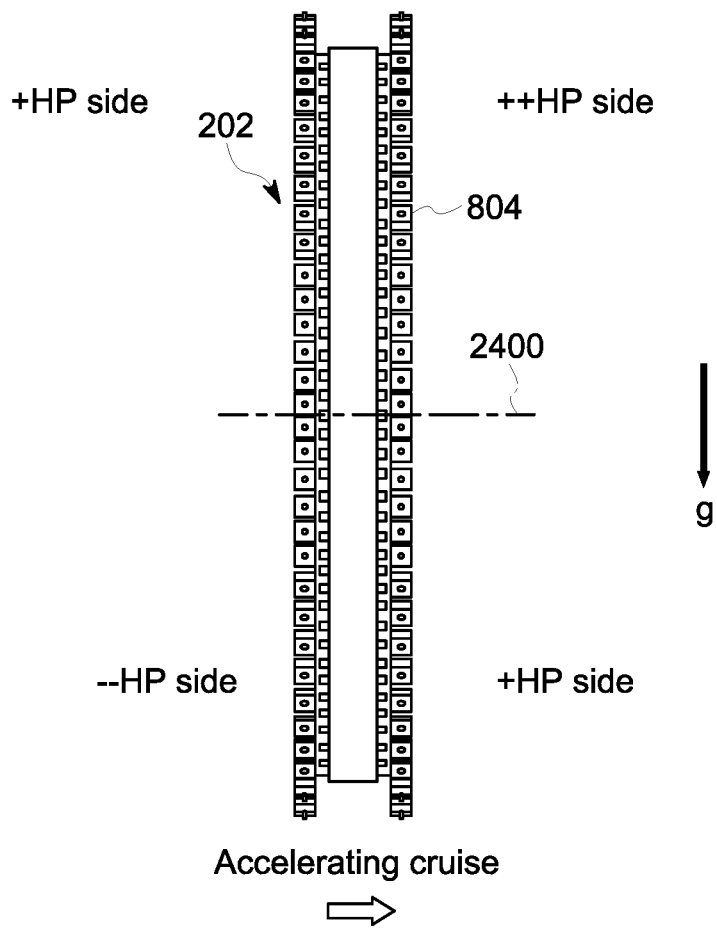
FIG. 25 also illustrates operation of one or more of the heat pipe assemblies shown in FIG. 8 in the motor shown in FIG. 2 that is disposed on the moving system.

FIGS. 23 through 25 illustrate operation of one or more of the heat pipe assemblies 804 in the motor 202 that is disposed on a moving system. While the description and illustration focuses on the heat pipe assemblies 804, the description also can apply to other heat pipe assemblies described herein. The motor 202 may be onboard a moving system, such as a vehicle (e.g., an aircraft such as a fixed wing airplane or a helicopter) that experiences different gravitational and other forces due to acceleration of the vehicle. For example, during takeoff of an aircraft (shown in FIG. 23) from the ground, the motor 202 can experience acceleration forces a+g due to both the pull of gravity toward the ground (e.g., g) and acceleration of the aircraft away from the ground (e.g., a). These forces can cause the working fluid in the heat pipe assemblies 804 to be drawn to one wall or side of the interior chambers inside the assemblies 804 than another.

For example, the heat pipe assemblies 804 below the motor 202 (relative to the direction in which the vehicle is acceleration, or below the motor 202 in FIG. 23) can have the working fluid pulled away from locations that are between the conductive coils 200 of the motor 202. This can result in decreased cooling of the coils 200 by the heat pipe assemblies 804 located below the motor 202 (relative to the heat pipe assemblies 804 operating without the acceleration forces a and/or gravity forces g acting on the working fluid). But, the heat pipe assemblies 804 above the motor 202 (relative to the direction in which the vehicle is acceleration, or above the motor 202 in FIG. 23) can have the working fluid pulled into locations that are between the conductive coils 200 of the motor 202. This can result in increased cooling of the coils 200 by the heat pipe assemblies 804 located above the motor 202 (relative to the heat pipe assemblies 804 operating without the acceleration forces a and/or gravity forces g acting on the working fluid).

The net effect of the decreased cooling of half of the heat pipe assemblies 804 and the increased cooling of the other half of the heat pipe assemblies 804 can result in the coils 200 being cooled at the same rate and/or by the same amount that the coils 200 would have been cooled without the influence of the acceleration forces a and/or gravity forces g acting on the working fluid. For example, the increased cooling by the heat pipe assemblies 804 above the motor 202 can counteract and cancel out the decreased by the heat pipe assemblies 804 below the motor 202.

As another example, during constant velocity cruising of the aircraft (shown in FIG. 24), the aircraft may be moving in directions that are more parallel to the ground than away from the ground (e.g., takeoff) or toward the ground (e.g., landing). The motor 202 can experience gravity forces g due to the pull of gravity toward the ground. These forces can cause the working fluid in the heat pipe assemblies 804 on the lower half of the motor 202 (e.g., below a bisecting plane 2400) to be drawn to one wall or side of the interior chambers inside the assemblies 804 than another. For example, the heat pipe assemblies 804 below the plane 2400 can have the working fluid pulled away from locations that are between the conductive coils 200 of the motor 202. This can result in decreased cooling of the coils 200 by the heat pipe assemblies 804 located below the motor 202 (relative to the heat pipe assemblies 804 operating without the gravity forces g acting on the working fluid). But, the heat pipe assemblies 804 above the plane 2400 can have the working fluid pulled into locations that are between the conductive coils 200 of the motor 202. This can result in increased cooling of the coils 200 by the heat pipe assemblies 804 located below the plane 2400 (relative to the heat pipe assemblies 804 operating without the gravity forces g acting on the working fluid).

The coils of the motor can be wound with parallel paths such that the top half of the motor forms one parallel path and the lower half of the motor forms a second parallel path. By adding parallel winding paths to the motor, the net effect of the decreased cooling of half of the heat pipe assemblies 804 and the increased cooling of the other half of the heat pipe assemblies 804 can result in the coils 200 being cooled at the same rate and/or by the same amount that the coils 200 would have been cooled without the influence of the gravity forces g acting on the working fluid. For example, the increased cooling by the heat pipe assemblies 804 above the plane 2400 can counteract and cancel out the decreased by the heat pipe assemblies 804 below the plane 2400. This leveling of temperature occurs due to the positive temperature coefficient on the electrical resistivity of copper as a function of temperature.

If the coils on the top half of the motor were at a lower temperature than those in the lower half of the motor, the electric currents being conducted in the coils are redistributed in that the amount of current conducted in the coils in the top half of the motor increases while decreasing the amount of current conducted in the coils in the lower half of the motor. This occurs because the current is conducted more easily in the lower temperature half of the motor than in the hotter lower half of the motor. This would result in the temperature of the cooler coils on the top half of the motor increasing (due to more current being conducted in these coils) and the temperature of the warming coils on the bottom half of the motor decreasing (due to less current being conducted in these coils). In effect, the combination of parallel winding paths and heat-pipe cooling forms a "self-leveling" process which cancels out the increased or decreased cooling (as applicable) due to the orientation of the heat pipe assemblies.

While only two parallel winding paths of coils are shown and described (e.g., top and bottom half coils), the motor windings may be segmented into a different number of parallel winding paths up to and including where each motor winding is in parallel with all others. For example, the windings on the top half of the motor may be one parallel conductive path and the windings in the bottom half of the motor may be another, different parallel conductive path. Alternatively, more than two parallel paths may be provided.

As another example, during cruising of the aircraft, the aircraft may accelerate in a direction that is parallel to the ground (shown in FIG. 25). During this lateral or horizontal acceleration, the motor 202 can experience acceleration forces a and gravitational forces g in different directions. The acceleration forces a can pull on the working fluid in one direction (e.g., opposite of the Accelerating Cruise arrow shown in FIG. 25) while the gravity forces g pull on the working fluid in a perpendicular direction (e.g., toward the ground). These forces can cause the working fluid in the heat pipe assemblies 804 to be drawn in different directions.

For example, the heat pipe assemblies 804 that are along a leading side of the motor 202 (e.g., the right side of the motor 202 in FIG. 25) and that are above the bisecting plane 2400 can have both the acceleration forces a and the gravity forces g pull the working fluid in these assemblies 804 to locations between the coils 200. This can result in significantly improved cooling of the coils 200 relative to other heat pipe assemblies 804. Conversely, the heat pipe assemblies 804 that are along the opposite, trailing side of the motor 202 (e.g., the left side of the motor 202 in FIG. 25) and that are below the bisecting plane 2400 can have both the acceleration forces a and the gravity forces g pull the working fluid in these assemblies 804 to locations away from the coils 200. This can result in significantly decreased cooling of the coils 200 relative to other heat pipe assemblies 804.

The heat pipe assemblies 804 that are along the leading side of the motor 202 and that are below the bisecting plane 2400 can have the acceleration forces a pull the working fluid in these assemblies 804 to locations between the coils 200, but the gravity forces g pull the working fluid away from locations between the coils 200. This can result in improved cooling of the coils 200 relative to other heat pipe assemblies 804 other than the heat pipe assemblies 804 that are above the plane 2400 and along the leading side of the motor 202. The heat pipe assemblies 804 that are along the trailing side of the motor 202 and that are above the bisecting plane 2400 can have the gravity forces g pull the working fluid in these assemblies 804 to locations between the coils 200, but also can have the acceleration forces a pull the working fluid in these assemblies 804 to locations that are not between the coils 200. This can result in improved cooling of the coils 200 relative to heat pipe assemblies 804 other than the heat pipe assemblies 804 that are above the plane 2400 and along the leading side of the motor 202.

The net effect of the different amounts of cooling different quadrants of the heat pipe assemblies 804 can result in the coils 200 being cooled at the same rate and/or by the same amount that the coils 200 would have been cooled without the influence of the acceleration forces a and/or gravity forces g acting on the working fluid.

Figure 26:
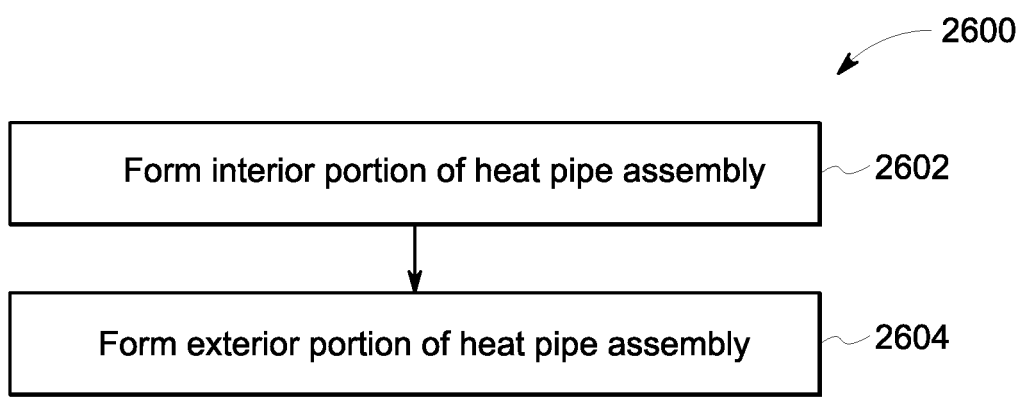
FIG. 26 illustrates a flowchart of one embodiment of a method for forming a heat pipe assembly for cooling an electric machine.

FIG. 26 illustrates a flowchart of one embodiment of a method 2600 for forming a heat pipe assembly for cooling an electric machine. The method 2600 can be used to create one or more of the heat pipe assemblies shown and/or described herein. Two or more of the operations described in connection with the method 2600 can be performed at the same time (e.g., concurrently or simultaneously), or may be performed sequentially.

At 2602, an interior portion of a heat pipe assembly is formed. The interior portion of the heat pipe assembly can define part of a vapor chamber that is shaped to be positioned against or close to conductive portions of an electric machine. For example, the interior portion can be sized to fit between coils of a stator, can be sized as an end bell to fit against the coils of the stator, can be sized to be placed outside of the stator of the motor, can be sized to be placed between the rotor and the stator of the motor, can be sized to be placed around or between magnets inserted in the rotor and the surrounding portion of the rotor in the motor, can be sized to be placed around or between conductive rods inserted in the rotor and the surrounding portion of the rotor in the motor, can be sized to be placed around or against conductive coils of a transformer, or the like. The interior portion can be formed to have a porous wick structure on one or more interior surfaces of the interior portion. As described above, this wick structure can hold a working fluid to help cool the electric machine. The interior portion of the heat pipe assembly can be created using additive manufacturing in one embodiment.

Optionally, the interior portion can be formed to have one or more interior support posts. As described above, these posts can mechanically support opposite sides of the heat pipe assembly from moving toward each other during operation of the electric machine.

At 2604, an exterior portion of the heat pipe assembly is formed. The exterior portion can be formed with the interior portion, such as by additively manufacturing the interior and exterior portions at the same time or during the same printing session. Alternatively, the interior and exterior portions can be formed at different times. The exterior portion also can include the interior porous wick structure to hold or help condense the working fluid described above.

The exterior portion may be formed to be away from the source of heat that vaporizes the working fluid in the interior portion of the heat pipe assembly. For example, the interior and exterior portions can be formed in an L-shape, with the interior portion shaped to fit between neighboring coils of the stator of the motor and the exterior portion disposed outside of (e.g., not between) the coils. As another example, the exterior portion can be a portion of the heat pipe assembly that is farther from the coils in the end bell heat pipe assembly, that is farther from the magnets or conductive rods in the rotor than the interior portion, that is farther from the rotor that the interior portion, or the like. In one embodiment, the exterior portion can be formed as an extension of a transformer bobbin to allow the working fluid to move away from the coils of the transformer and cool in the exterior portion of the heat pipe assembly.

In one embodiment, a heat pipe assembly includes plural connected walls having porous wick linings along the walls, an insulating layer coupled with at least one of the walls on a side of the at least one wall that is opposite of the porous wick lining of the at least one wall, and an interior chamber disposed inside and sealed by the walls. The porous wick linings of the walls are configured to hold a liquid phase of a working fluid in the interior chamber. The insulating layer of the at least one wall is directly against a conductive component of an electromagnetic power conversion device such that heat from the conductive component vaporizes the working fluid in the porous wick lining of the at least one wall and the working fluid condenses at or within the porous wick lining of at least one other wall to cool the conductive component of the electromagnetic power conversion device.

Optionally, the conductive component includes one or more conductive windings of the electromagnetic power conversion device such that the heat from the one or more conductive windings vaporizes the working fluid in the porous wick lining of the interior wall and the working fluid condenses at or within the porous wick lining of the outer wall to cool the one or more conductive windings of the electromagnetic power conversion device.

Optionally, the walls form an elongated interior portion of the interior chamber that is located between and directly adjacent to neighboring conductive coils of the one or more conductive windings.

Optionally, the interior portion of the interior chamber is elongated along an axis of rotation of the electromagnetic power conversion device.

Optionally, the walls also form an elongated exterior portion of the interior chamber that is located outside of the conductive coils.

Optionally, the exterior portion of the interior chamber is elongated in directions that are perpendicular to an axis of rotation of the electromagnetic power conversion device.

Optionally, the assembly also includes elongated fins outwardly extending from the exterior portion.

Optionally, the elongated exterior portion of the interior chamber is elongated in a direction radially oriented toward an axis of rotation of the electromagnetic power conversion device.

Optionally, the elongated exterior portion of the interior chamber is elongated in a direction radially oriented away from an axis of rotation of the electromagnetic power conversion device.

Optionally, the interior portion of the interior chamber has a rectangular cross-sectional shape in locations between the neighboring conductive coils.

Optionally, the interior portion of the interior chamber extends between and contacts the neighboring conductive coils on multiple different planes of the conductive coils.

Optionally, the interior portion of the interior chamber has a T-shaped cross-sectional shape.

Optionally, the interior portion of the interior chamber is located between and contacts opposing surfaces of the neighboring conductive coils that are concentrated windings of an electric motor.

Optionally, the interior portion of the interior chamber is located between and contacts opposing surfaces of the neighboring conductive coils that are distributed windings of an electric motor.

Optionally, the interior portion of the interior chamber has an H-shaped cross-sectional shape.

Optionally, the assembly also includes an end bell that couples with conductive windings of a motor as the electromagnetic power conversion device. The walls and the interior chamber can be located within the end bell.

Optionally, the walls are located outside of and directly contact a stator of a motor that is the electromagnetic power conversion device.

Optionally, the walls form elongated fins that radially project away from an axis of rotation of the motor, and wherein the interior chamber extends into the fins.

Optionally, the assembly also includes support posts located between the walls to structurally support the walls away from each other.

Optionally, the walls form a rotor sleeve and end plate in which a rotor of a motor is located as the electromagnetic power conversion device.

Optionally, the rotor sleeve formed by the walls encircles the rotor around an axis of rotation of the rotor.

Optionally, the end plate formed by the walls is oriented perpendicular to an axis of rotation of the rotor.

Optionally, the end plate includes elongated fins that axially project away from the end plate in directions parallel to the axis of rotation. The interior chamber can extend into the elongated fins.

Optionally, the walls extend around a permanent magnet in an interior permanent magnet motor as the electromagnetic power conversion device.

Optionally, the walls extend around a magnet in an induction motor of a field wound motor as the electromagnetic power conversion device.

Optionally, the walls extend around a bobbin of a transformer as the electromagnetic power conversion device, with the walls and interior chamber disposed between conductive windings of the transformer and the bobbin.

Optionally, the walls form an extension of the interior chamber that extends along a length of the bobbin but is not located between the bobbin and the conductive windings of the transformer.

In one embodiment, a heat pipe system includes plural heat pipe assemblies configured to be disposed directly against conductive windings of an electric motor to cool the windings. Each of the heat pipe assemblies includes plural connected walls having porous wick linings along the walls. The walls include at least an interior wall, an outer wall, and a connecting wall that couples the interior wall with the outer wall. Each of the heat pipe assemblies also includes an interior chamber disposed inside and sealed by the walls. The porous wick linings of the walls are configured to hold a liquid phase of a working fluid in the interior chamber. The interior walls of the heat pipe assemblies are configured to be located directly against the conductive windings of the motor such that heat from the conductive windings vaporizes the working fluids in the porous wick linings of the interior walls of the heat pipe assemblies. The working fluid condenses at or within the porous wick linings of the outer walls of the heat pipe assemblies to cool the conductive windings of the motor.

Optionally, the walls of the heat pipe assemblies form elongated interior portions of the interior chambers that are located between and directly adjacent to neighboring conductive windings of the one or more conductive windings. The walls of the heat pipe assemblies also can form elongated exterior portions of the interior chambers that are located outside of the conductive windings of the motor.

Optionally, the interior portions of the interior chambers are elongated in directions that are parallel to an axis of rotation of the motor.

Optionally, the exterior portions of the interior chambers are elongated in directions that are perpendicular to an axis of rotation of the motor.

Optionally, at least one of the heat pipe assemblies also includes elongated fins outwardly extending from the exterior portions of the heat pipe assemblies.

Optionally, the conductive windings of the motor extend along a circular ring around an axis of rotation of the motor. The exterior portions of the heat pipe assemblies all can be located on a single side of the ring.

Optionally, the conductive windings of the motor extend along a circular ring around an axis of rotation of the motor. The exterior portions of a first group of the heat pipe assemblies can be located on a first side of the ring and the exterior portions of a second, non-overlapping group of the heat pipe assemblies can be located on an opposite second side of the ring.

Optionally, the exterior portions of the heat pipe assemblies are elongated in directions that are oriented radially inward toward an axis of rotation of the motor.

Optionally, the exterior portions of the heat pipe assemblies are elongated in directions that are oriented radially outward from an axis of rotation of the motor.

Optionally, the heat pipe assemblies assist in self-leveling a temperature differential of the conductive windings of the electric motor during operation of the electric motor by receiving more electric current in a first set of the conductive windings that are cooler due to the working fluid in a corresponding first set of the heat pipe assemblies being directed to locations closer to the conductive windings in the first set of the conductive windings due to one or more of gravitational forces or acceleration forces, and by a different, second set of the conductive windings of the electric motor that are hotter receiving less electric current due to the working fluid in a corresponding second set of the heat pipe assemblies being directed to locations farther from the conductive windings in the second set of the conductive windings due to the one or more of gravitational forces or acceleration forces.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, including the best mode, and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A heat pipe assembly comprising:
plural connected walls having porous wick linings along the walls,
wherein the walls form and seal an interior chamber,
wherein the porous wick linings of the walls are configured to hold a liquid phase of a working fluid in the interior chamber;
wherein the walls are shaped and sized to be located outside of and directly contact a stator of a motor; and
wherein the walls form elongated fins that radially project away from an axis of rotation of the motor, and wherein the interior chamber extends into the fins.

2. The heat pipe assembly of claim 1, further comprising; support posts located between the walls to structurally support the walls away from each other.

3. The heat pipe assembly of claim 1, wherein the walls form a rotor sleeve and end plate in which the rotor of the motor is located.

4. The heat pipe assembly of claim 3, wherein the end plate includes elongated fins that axially project away from the end plate in directions parallel to the axis of rotation, wherein the interior chamber extends into the elongated fins of the end plate.

5. A plurality of heat pipe assemblies, wherein each of the heat pipe assemblies comprises:
plural connected walls having porous wick linings along the walls, wherein the walls form and seal an interior chamber, and wherein the porous wick linings of the walls are configured to hold a liquid phase of a working fluid in the interior chamber,
wherein a plurality of conductive windings extend along a circular ring around an axis of rotation of an electromagnetic power conversion device, and
wherein the plurality of heat pipe assemblies comprises:
a first group of heat pipe assemblies disposed on a first side of the ring along a direction of the axis of rotation, and
a second group of heat pipe assemblies disposed on a second side of the ring opposite the first side along the direction of the axis of rotation.

6. The heat pipe assembly of claim 5, wherein the first group of heat pipe assemblies and the second group of heat pipe assemblies do not overlap in the direction of the axis of rotation.

7. The heat pipe assembly of claim 5, wherein the first and second groups of heat pipe assemblies extend outward in a radial direction of the ring.

8. A heat pipe assembly comprising:
plural connected walls having porous wick linings along the walls,
wherein the walls form and seal an interior chamber,
wherein the porous wick linings of the walls are configured to hold a liquid phase of a working fluid in the interior chamber, and
wherein the walls are in a shape of a motor end bell to engage coils of a motor and are configured to be positioned proximate to the coils of the motor such that heat therefrom at least partially vaporizes the working fluid in the porous wick lining of the at least one wall and the working fluid condenses at or within the porous wick lining of at least one other wall to cool the coils of the motor.

9. A heat pipe assembly comprising:
plural connected walls having porous wick linings along the walls,
wherein the walls form and seal an interior chamber,
wherein the porous wick linings of the walls are configured to hold a liquid phase of a working fluid in the interior chamber, and
wherein the walls are in a shape of a transformer bobbin to engage coils of a transformer and are configured to be positioned proximate to the coils of the transformer such that heat therefrom at least partially vaporizes the working fluid in the porous wick lining of the at least one wall and the working fluid condenses at or within the porous wick lining of at least one other wall to cool the coils of the transformer.

10. A heat pipe assembly comprising:
plural connected walls having porous wick linings along the walls,
wherein the walls form and seal an interior chamber,
wherein the porous wick linings of the walls are configured to hold a liquid phase of a working fluid in the interior chamber, and
wherein the walls are in a shape of a rotor sleeve to extend around an exterior of a rotor and are configured to be positioned proximate to the rotor such that heat therefrom at least partially vaporizes the working fluid in the porous wick lining of the at least one wall and the working fluid condenses at or within the porous wick lining of at least one other wall to cool the rotor.

11. A heat pipe assembly comprising:
plural connected walls having porous wick linings along the walls,
wherein the walls form and seal an interior chamber,
wherein the porous wick linings of the walls are configured to hold a liquid phase of a working fluid in the interior chamber, and
wherein the walls are in a shape of an outer housing of a motor and are configured to be positioned proximate to an exterior of the motor such that heat therefrom at least partially vaporizes the working fluid in the porous wick lining of the at least one wall and the working fluid condenses at or within the porous wick lining of at least one other wall to cool the exterior of the motor.

12. A heat pipe assembly comprising:
plural connected walls having porous wick linings along the walls,
wherein the walls form and seal an interior chamber,
wherein the porous wick linings of the walls are configured to hold a liquid phase of a working fluid in the interior chamber, and
wherein the walls are in a shape of an enclosure for a magnet of a motor and are configured to be positioned proximate to the magnet of the motor such that heat therefrom at least partially vaporizes the working fluid in the porous wick lining of the at least one wall and the working fluid condenses at or within the porous wick lining of at least one other wall to cool the magnet of the motor.

13. A heat pipe assembly comprising:
plural connected walls having porous wick linings along the walls,
wherein the walls form and seal an interior chamber, wherein the porous wick linings of the walls are configured to hold a liquid phase of a working fluid in the interior chamber, and wherein the walls are in a shape of an enclosure for a conductive rod of a motor and are configured to be positioned proximate to the conductive rod of the motor such that heat therefrom at least partially vaporizes the working fluid in the porous wick lining of the at least one wall and the working fluid condenses at or within the porous wick lining of at least one other wall to cool the conductive rods of the motor.

14. A heat pipe assembly comprising:

plural connected walls having porous wick linings along the walls, wherein the walls form and seal an interior chamber, wherein the porous wick linings of the walls are configured to hold a liquid phase of a working fluid in the interior chamber, and wherein the heat pipe assembly further comprises:

an insulating layer coupled with at least one of the walls on a side of the at least one wall that is opposite of the porous wick lining of the at least one wall, and wherein the insulating layer of the at least one wall is directly against a conductive component of an electromagnetic power conversion device such that heat from the conductive component vaporizes the working fluid in the porous wick lining of the at least one wall and the working fluid condenses at or within the porous wick lining of at least one other wall to cool the conductive component of the electromagnetic power conversion device.

15. A heat pipe assembly comprising:

plural connected walls having porous wick linings along the walls, wherein the walls form and seal an interior chamber, wherein the porous wick linings of the walls are configured to hold a liquid phase of a working fluid in the interior chamber, and wherein the heat pipe assembly further comprises:

an insulating layer coupled with at least one of the walls on a side of the at least one wall that is opposite of the porous wick lining of the at least one wall, and wherein the insulating layer of the at least one wall directly contacts against conductive coils of both adjacent conductive windings of an electromagnetic power conversion device such that heat from the conductive windings vaporizes the working fluid in the porous wick lining of the at least one wall and the working fluid condenses at or within the porous wick lining of at least one other wall to cool the conductive windings of the electromagnetic power conversion device.

16. The heat pipe assembly of claim 15, wherein the walls form an elongated interior portion of the interior chamber that is located between and directly adjacent to neighboring conductive coils of the conductive windings, and wherein the walls also form an elongated exterior portion of the interior chamber that is located outside of the conductive coils.

17. A heat pipe assembly comprising:

plural connected walls having porous wick linings along the walls, wherein the walls form and seal an interior chamber, wherein the porous wick linings of the walls are configured to hold a liquid phase of a working fluid in the interior chamber, and wherein the heat pipe assembly further comprises:

an insulating layer coupled with at least one of the walls on a side of the at least one wall that is opposite of the porous wick lining of the at least one wall, wherein the heat assembly includes a first portion that is disposed between coils of adjacent conductive windings of an electromagnetic power conversion device in a circumferential direction, and a second portion that is disposed on an inner radial side of the first portion and the adjacent conductive windings.

18. The heat pipe assembly of claim 17, wherein the second portion is spaced apart from the adjacent conductive windings.

* * * * *